(12) United States Patent
Yu et al.

(10) Patent No.: US 9,455,685 B2
(45) Date of Patent: Sep. 27, 2016

(54) ACOUSTIC FILTER WITH SUPPRESSED NONLINEAR CHARACTERISTICS

(71) Applicant: SAMSUNG ELECTRONICS CO., LTD., Suwon-si (KR)

(72) Inventors: Jie Ai Yu, Suwon-si (KR); Duck Hwan Kim, Goyang-si (KR); Ho Soo Park, Yongin-si (KR); In Sang Song, Osan-si (KR); Jea Shik Shin, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 5 days.

(21) Appl. No.: 14/287,524

(22) Filed: May 27, 2014

(65) Prior Publication Data

US 2015/0097638 A1  Apr. 9, 2015

(30) Foreign Application Priority Data

Oct. 7, 2013  (KR) ........................ 10-2013-0119408

(51) Int. Cl.
| | |
|---|---|
| H03H 9/46 | (2006.01) |
| H03H 9/60 | (2006.01) |
| H03H 9/54 | (2006.01) |
| H03H 9/00 | (2006.01) |
| H03H 9/02 | (2006.01) |

(52) U.S. Cl.
CPC ............. *H03H 9/605* (2013.01); *H03H 9/542* (2013.01); *H03H 9/02086* (2013.01)

(58) Field of Classification Search
CPC ......... H03H 9/70; H03H 9/605; H03H 9/542

USPC ....... 333/133, 187, 189, 191, 192, 193, 194, 333/195
See application file for complete search history.

(56) References Cited

U.S. PATENT DOCUMENTS

| | | | |
|---|---|---|---|
| 7,479,847 B2 * | 1/2009 | Yamakawa et al. | .......... 333/133 |
| 7,515,018 B2 | 4/2009 | Handtmann et al. | |
| 7,535,323 B2 | 5/2009 | Barber et al. | |
| 7,755,453 B2 | 7/2010 | Iwaki et al. | |
| 8,018,298 B2 * | 9/2011 | Ueda et al. | .................... 333/133 |
| 8,026,776 B2 * | 9/2011 | Ueda | ................... H03H 9/6483 |
| | | | 333/133 |
| 8,093,960 B2 | 1/2012 | Inoue et al. | |

(Continued)

FOREIGN PATENT DOCUMENTS

| | | |
|---|---|---|
| JP | 2010-192974 A | 9/2010 |
| JP | 4816234 B2 | 9/2011 |

OTHER PUBLICATIONS

Cho, Yasuo, et al. "Nonlinear equivalent circuits of acoustic devices." Electronics and Communications in Japan (1993): 867-872.

(Continued)

Primary Examiner — Dean Takaoka
(74) Attorney, Agent, or Firm — NSIP Law

(57) ABSTRACT

An acoustic filter includes a signal input port, a ladder-type filter, a first branch ladder-type filter, a second branch ladder-type filter, and a signal output port. The first branch ladder-type filter and the second branch ladder-type filter are connected in parallel to each other. The signal input port is connected to the ladder-type filter. The ladder-type filter circuit is connected in series to the first branch ladder-type filter and the second branch ladder-type filter. The first branch ladder-type filter circuit and the second branch ladder-type filter are connected to the signal output port.

18 Claims, 24 Drawing Sheets

(56) References Cited

U.S. PATENT DOCUMENTS

| 8,344,825 | B2 | 1/2013 | Nishizawa et al. | |
| 8,531,252 | B2* | 9/2013 | Nakamura et al. | 333/133 |
| 2012/0098624 | A1* | 4/2012 | Link | 333/189 |
| 2012/0119847 | A1 | 5/2012 | Iwaki et al. | |

OTHER PUBLICATIONS

Handtmann, Martin, et al. "Stacked crystal resonator: A highly linear BAW device." Ultrasonics Symposium (IUS), 2009 IEEE International. IEEE, 2009: 889-892.

* cited by examiner

200

300

400

ACOUSTIC FILTER WITH SUPPRESSED NONLINEAR CHARACTERISTICS

CROSS-REFERENCE TO RELATED APPLICATION(S)

This application claims the benefit under 35 USC 119(a) of Korean Patent Application No. 10-2013-0119408, filed on Oct. 7, 2013, in the Korean Intellectual Property Office, the entire disclosure of which is incorporated herein by reference for all purposes.

BACKGROUND

1. Field

The following description relates to a bulk acoustic wave (BAW) apparatus.

2. Description of Related Art

Duplexers based on bulk acoustic wave (BAW) resonators are widely used in mobile communication systems. Duplexers have excellent performances, for example, low insertion loss, high isolation, and good stop-band attenuation, and may be integrated with a complementary metal-oxide-semiconductor (CMOS) circuit at a relatively low cost. In an example of a duplexer, a high-power signal may be applied to a transmission (TX) filter and, as a result, the TX filter may generate nonlinear output, for example, second harmonics and inter-modulation effects. However, the nonlinear output may not be allowed in a strict mobile communication standard, for example, a code division multiple access (CDMA) system.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an illustrative configuration, an acoustic filter may include a ladder-type filter connected to a signal input port; and a first branch ladder-type filter and a second branch ladder-type filter connected in parallel to each other and connected in series between the ladder-type filter circuit and a signal output port.

The ladder-type filter may include serial resonators, and shunt resonators. The serial resonators and the shunt resonators are connected in a ladder configuration.

The ladder-type filter may include serial resonators, shunt resonators, and an inductor. The inductor is connected in series between a ground and one of the shunt resonators.

Each of the ladder-type filter, the first branch ladder-type filter, and the second branch ladder-type filter may include a serial resonator and a shunt resonator.

Each of the first branch ladder-type filter and the second branch ladder-type filter may include a serial resonator, a shunt resonator, and an inductor, wherein the shunt resonator of the first branch ladder-type filter is connected to a ground through the inductor of the first branch ladder-type filter, and wherein the shunt resonator of the second branch ladder-type filter is connected to the ground through the inductor of the second branch ladder-type filter.

The ladder-type filter may include an inductor, wherein each of the first branch ladder-type filter and the second branch ladder-type filter may include a shunt resonator and a serial resonator, and wherein the shunt resonator is connected to a ground through the inductor.

Each of the first branch ladder-type filter and the second branch ladder-type filter may include serial resonators and a shunt resonator, and wherein C-axis direction of the serial resonators in the first branch ladder-type filter may be identical to each other and C-axis directions of the serial resonators in the second branch ladder-type filter are identical to each other.

Each of the first branch ladder-type filter and the second branch ladder-type filter may include serial resonators and a shunt resonator, and wherein C-axis direction of the serial resonators in the first branch ladder-type filter are opposite to each other and C-axis directions of the serial resonators in the second branch ladder-type filter are opposite to each other.

Each of the first branch ladder-type filter and the second branch ladder-type filter may include serial resonators, a shunt resonator, and an inductor, wherein the inductor of the first branch ladder-type filter is connected in series between a ground and the shunt resonator of the first branch ladder-type filter, and wherein the inductor of the second branch ladder-type filter is connected in series between the ground and the shunt resonator of the second branch ladder-type filter.

The first branch ladder-type filter may include serial resonators and a shunt resonator, wherein the second branch ladder-type filter may include serial resonators, a shunt resonator, and an inductor, wherein the shunt resonators are connected to a ground through the inductor.

Each of the first branch ladder-type filter and the second branch ladder-type filter may include a serial resonator and a shunt resonator, wherein a C-axis direction of the serial resonator in the first branch ladder-type filter is opposite to a C-axis direction of the serial resonator in the second branch ladder-type filter, and wherein a C-axis direction of the shunt resonator in the first branch ladder-type filter is opposite to a C-axis direction of the shunt resonator in the second branch ladder-type filter.

Each of the ladder-type filter, the first branch ladder-type filter, and the second branch ladder-type filter may include a serial resonator and a shunt resonator, and wherein the serial resonator and the shunt resonator are bulk acoustic wave (BAW) resonators.

The first branch ladder-type filter may include a serial resonator, wherein the second branch ladder-type filter may include a serial resonator, and wherein the serial resonator of the first branch ladder-type filter has the same size as the serial resonator of the second branch ladder-type filter.

The first branch ladder-type filter may include a shunt resonator, wherein the second branch ladder-type filter may include a shunt resonator, and wherein the shunt resonator of the first branch ladder-type filter has the same size as the shunt resonator of the second branch ladder-type filter.

In accordance with an illustrative configuration, there is provided an acoustic filter, including a first branch ladder-type filter and a second branch ladder-type filter connected in parallel to each other and connected in series between a signal input port and a signal output port.

The first branch ladder-type filter may include serial resonators and shunt resonators.

The first branch ladder-type filter may include serial resonators, shunt resonators, and an inductor, and wherein the inductor is connected in series between a ground and one of the shunt resonators.

The second branch ladder-type filter may include serial resonators and shunt resonators.

The second branch ladder-type filter may include serial resonators, shunt resonators, and an inductor, and wherein the inductor is connected in series between a ground and one of the shunt resonators.

The first branch ladder-type filter may include serial resonators and shunt resonators, wherein the second branch ladder-type filter may include serial resonators, shunt resonators, and an inductor, and wherein the shunt resonators in the first branch ladder-type filter and the shunt resonators in the second branch ladder-type filter are connected to a ground through the inductor.

Other features and aspects will be apparent from the following detailed description, the drawings, and the claims.

BRIEF DESCRIPTION OF THE DRAWINGS

These and/or other aspects will become apparent and more readily appreciated from the following description of the embodiments, taken in conjunction with the accompanying drawings in which.

Figure 1:
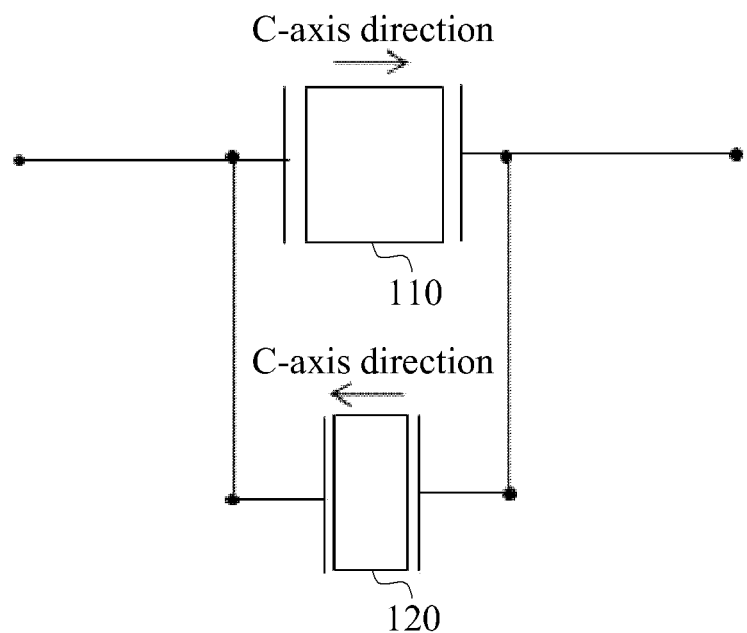
FIG. 1 is a diagram illustrating an example of related art resonators connected in anti-parallel to each other.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. Also, descriptions of functions and constructions that are well known to one of ordinary skill in the art may be omitted for increased clarity and conciseness.

Throughout the drawings and the detailed description, the same reference numerals refer to the same elements. The drawings may not be to scale, and the relative size, proportions, and depiction of elements in the drawings may be exaggerated for clarity, illustration, and convenience.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

It will be understood that when an element or layer is referred to as being "on" or "connected to" another element or layer, it can be directly on or operatively connected to the other element or layer or through intervening elements or layers may be present. In contrast, when an element is referred to as being "directly on" or "directly connected to" another element or layer, there are no intervening elements or layers present. Like reference numerals refer to like elements throughout. As used herein, the term "and/or" includes any and all combinations of one or more of the associated listed items.

Figure 2:
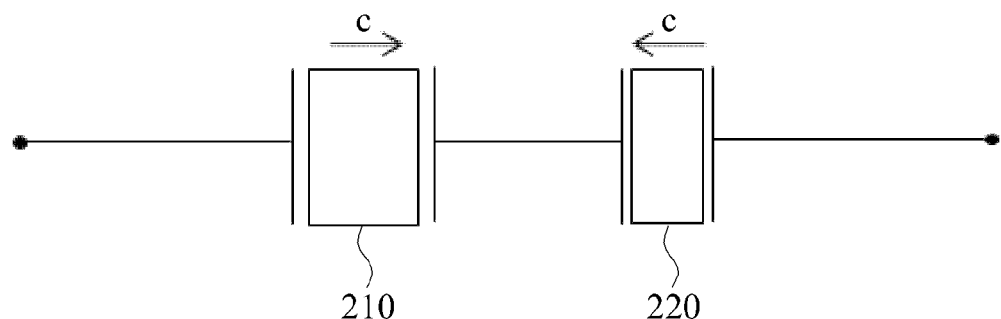
FIG. 2 is a diagram illustrating an example of related art resonators connected in anti-series to each other.

FIG. 1 illustrates an example of resonators that are connected in anti-parallel to each other, and FIG. 2 illustrates an example of resonators that are connected in anti-series to each other.

Referring to FIGS. 1 and 2, a resonator 100 includes resonators 110 and 120, which are connected in anti-parallel to each other, and a resonator 200 includes resonators 210 and 220, which are connected in anti-series to each other.

The resonators 110 and 120 are parallel connected with opposite C-axis directions, as illustrated in FIG. 1. For example, when a radio frequency (RF) signal is applied to each of the resonators 110 and 120, vibration states of the resonators 110 and 120 are different from each other. In this example, when the resonator 110 is in an expansion state, the resonator 120 may be in a contraction state, as illustrated in FIG. 1. Accordingly, nonlinear characteristics of the resonator 100 are suppressed through cancellation of the resonators 110 and 120 due to opposite stress states of the resonators 110 and 120.

As illustrated in FIG. 2, because the resonators 210 and 220 are connected in anti-series to each other, nonlinear characteristics of the resonator 200 are suppressed for similar reasons as those described above with reference to FIG. 1.

Figure 3:
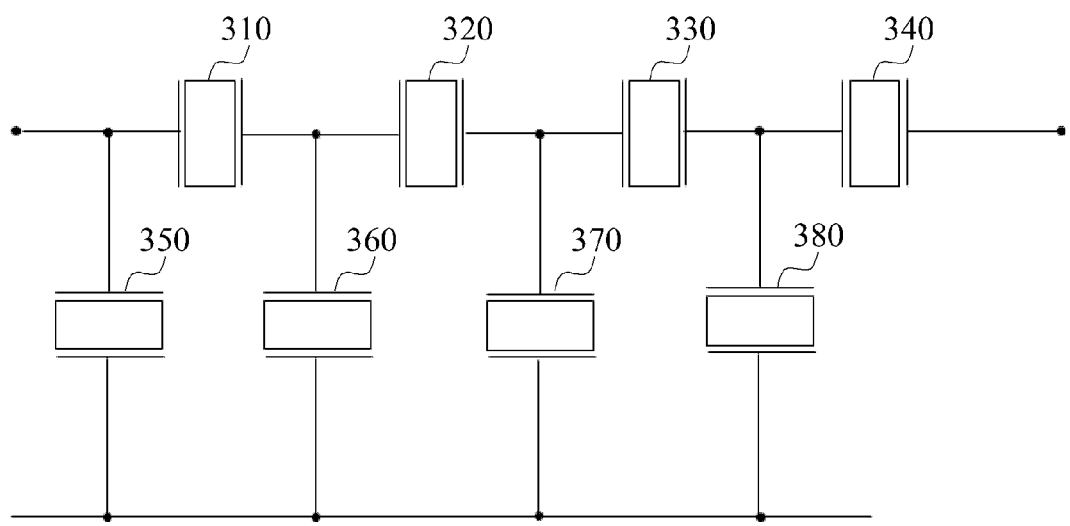
FIG. 3 is a diagram illustrating an example of a related art ladder-type filter.

FIG. 3 illustrates a ladder-type acoustic filter 300.

Referring to FIG. 3, the ladder-type acoustic filter 300 includes serial resonators 310, 320, 330 and 340, and shunt resonators 350, 360, 370 and 380.

Figure 4:
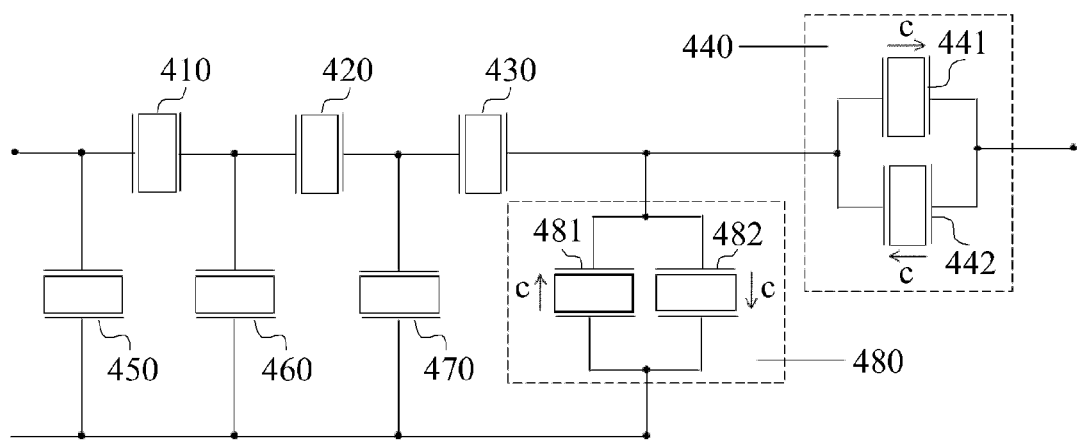
FIG. 4 is a diagram illustrating an example of a related art ladder-type filter with reduced nonlinear characteristics.

FIG. 4 illustrates a ladder-type acoustic filter 400 with reduced nonlinear characteristics.

Referring to FIG. 4, the ladder-type acoustic filter 400 includes four serial resonators 410, 420, 430 and 440, and four shunt resonators 450, 460, 470 and 480. The key serial resonator 440 may be replaced with two resonators 441 and 442 that are connected in anti-parallel to each other, and the key shunt resonator 480 may be replaced with two resonators 481 and 482 that are connected in anti-parallel to each other.

Hereinafter, various examples will be further described with reference to the accompanying drawings. The various examples provide an apparatus and a method to suppress nonlinear characteristics of an acoustic filter based on physical reasons for nonlinear characteristics of the acoustic filter.

In an example, an acoustic filter includes a serial resonator and a shunt resonator. The serial resonator and the shunt resonator include, for example, bulk acoustic wave (BAW) resonators. A BAW resonator may include a piezoelectric layer between two metal electrodes. In this example, an axis perpendicular to the piezoelectric layer is represented as a C axis, and C-axis directions are determined based on polarization of the piezoelectric layer. For example, a C-axis direction of a resonator may be set to be opposite to a C-axis direction of another resonator, based on polarization of the piezoelectric layer of the resonator. The acoustic filter may include a BAW filter.

Additionally, at least one serial resonator, at least one shunt resonator, and an inductor may be included in a ladder-type filter circuit, a first branch ladder-type filter circuit, and a second branch ladder-type filter circuit. The at least one serial resonator, the at least one shunt resonator, and the inductor may be connected in a ladder configuration.

Figure 5:
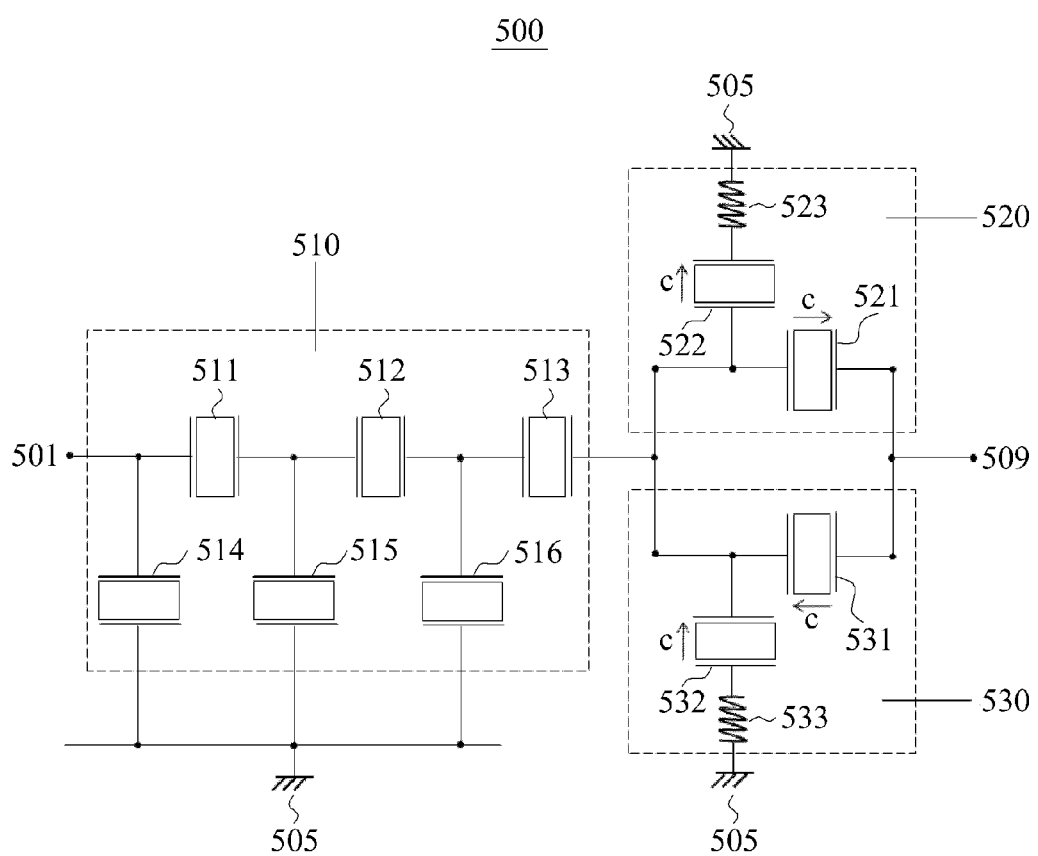
FIG. 5 illustrates an acoustic filter, in accord with an embodiment.

FIG. 5 illustrates an acoustic filter 500, in accord with an embodiment.

The acoustic filter 500 of FIG. 5 includes a ladder-type filter circuit 510, a first branch ladder-type filter circuit 520, a second branch ladder-type filter circuit 530, a signal input port 501, a signal output port 509, and grounds 505. The signal input port 501 is connected to the ladder-type filter circuit 510. The ladder-type filter circuit 510 is connected in series to the first branch ladder-type filter circuit 520 and the second branch ladder-type filter circuit 530. The first branch ladder-type filter circuit 520 and the second branch ladder-type filter circuit 530 are connected in parallel to each other, and are connected to the signal output port 509.

As illustrated in FIG. 5, the ladder-type filter circuit 510 includes three serial resonators 511, 512 and 513, and three shunt resonators 514, 515 and 516. The first branch ladder-type filter circuit 520 includes a serial resonator 521, a shunt resonator 522, and an inductor 523. The inductor 523 is connected in series between the shunt resonator 522 and the ground 505. The second branch ladder-type filter circuit 530 includes a serial resonator 531, a shunt resonator 532, and an inductor 533. In one illustrative configuration, a circuit topology of the first branch ladder-type filter circuit 520 is identical to a circuit topology of the second branch ladder-type filter circuit 530.

C-axis directions of the serial and the shunt resonators 521 and 522 in the first branch ladder-type filter circuit 520 are opposite to C-axis directions of corresponding serial and shunt resonators 631 and 632 in the second branch ladder-type filter circuit 530. For example, a C-axis direction of the serial resonator 521 is opposite to a C-axis direction of the serial resonator 531, and a C-axis direction of the shunt resonator 522 is opposite to a C-axis direction of the shunt resonator 532. Consequently, nonlinear characteristics of the acoustic filter 500 are self-cancelled by the first branch ladder-type filter circuit 520 and the second branch ladder-type filter circuit 530.

Figure 6:
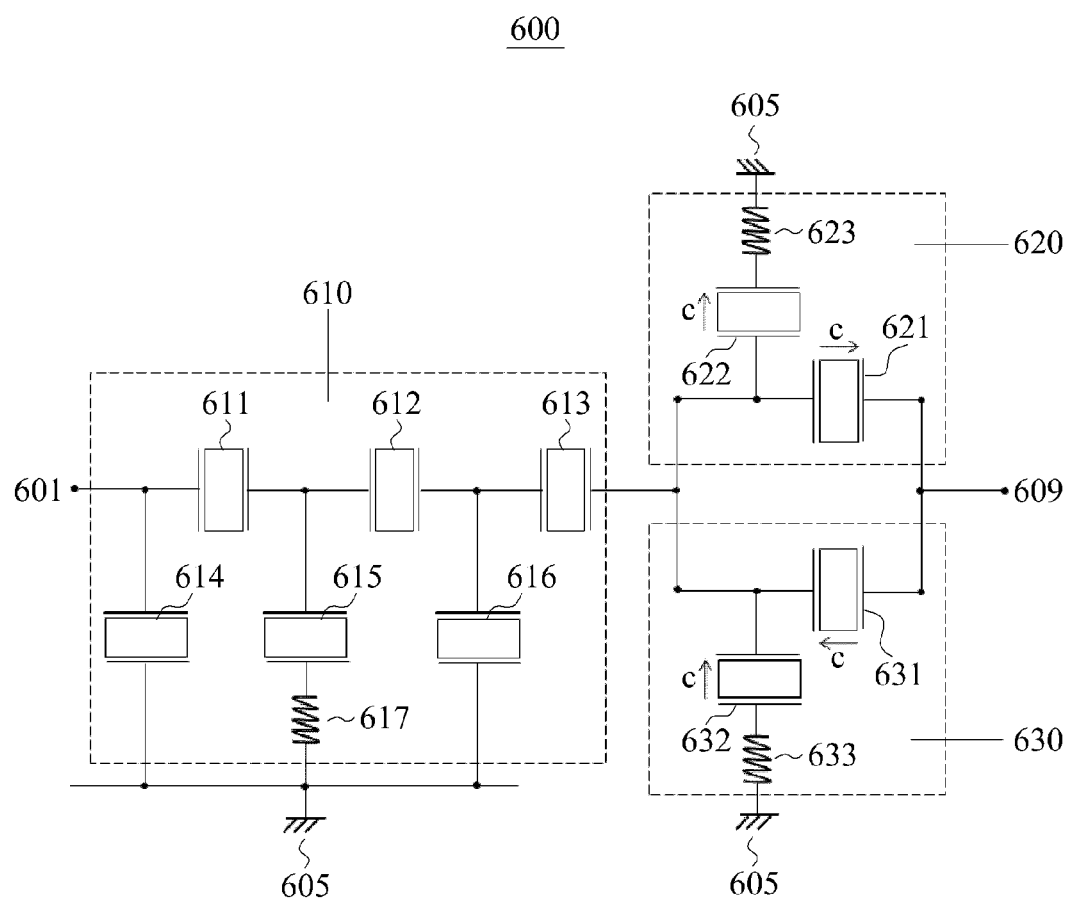
FIG. 6 illustrates an acoustic filter including a ladder-type filter circuit with an inductor, in accordance with an embodiment.

FIG. 6 illustrates an acoustic filter 600 including a ladder-type filter circuit with an inductor, in accordance with an embodiment.

The acoustic filter 600 of FIG. 6 includes a ladder-type filter circuit 610, a first branch ladder-type filter circuit 620, a second branch ladder-type filter circuit 630, a signal input port 601, a signal output port 609, and grounds 605. The signal input port 601 is connected to the ladder-type filter circuit 610. The ladder-type filter circuit 610 is connected in series to the first branch ladder-type filter circuit 620 and the second branch ladder-type filter circuit 630. The first branch ladder-type filter circuit 620 and the second branch ladder-type filter circuit 630 are connected in parallel to each other, and are connected to the signal output port 609.

As illustrated in FIG. 6, the ladder-type filter circuit 610 includes three serial resonators 611, 612 and 613, three shunt resonators 614, 615 and 616, and an inductor 617. The inductor 617 is connected in series between the shunt resonator 615 and the ground 605. The first branch ladder-type filter circuit 620 includes a serial resonator 621, a shunt resonator 622, and an inductor 623. The inductor 623 is connected in series between the shunt resonator 622 and the ground 605. The second branch ladder-type filter circuit 630 includes a serial resonator 631, a shunt resonator 632, and an inductor 633. A circuit topology of the first branch ladder-type filter circuit 620 is identical to a circuit topology of the second branch ladder-type filter circuit 630. Although the inductor 617 is connected to the shunt resonator 615, a person of ordinary skill in the relevant art will appreciate that the inductor 617 may be connected in series with another of the shunt resonators of the ladder-type filter circuit 610.

C-axis directions of the serial and the shunt resonators 621 and 622 in the first branch ladder-type filter circuit 620 are opposite to C-axis directions of corresponding resonators 631 and 632 in the second branch ladder-type filter circuit 630. For example, a C-axis direction of the serial resonator 621 is opposite to a C-axis direction of the serial resonator 631, and a C-axis direction of the shunt resonator 622 is opposite to a C-axis direction of the shunt resonator 632. Consequently, nonlinear characteristics of the acoustic filter 600 are self-cancelled by the first branch ladder-type filter circuit 620 and the second branch ladder-type filter circuit 630.

Figure 7:
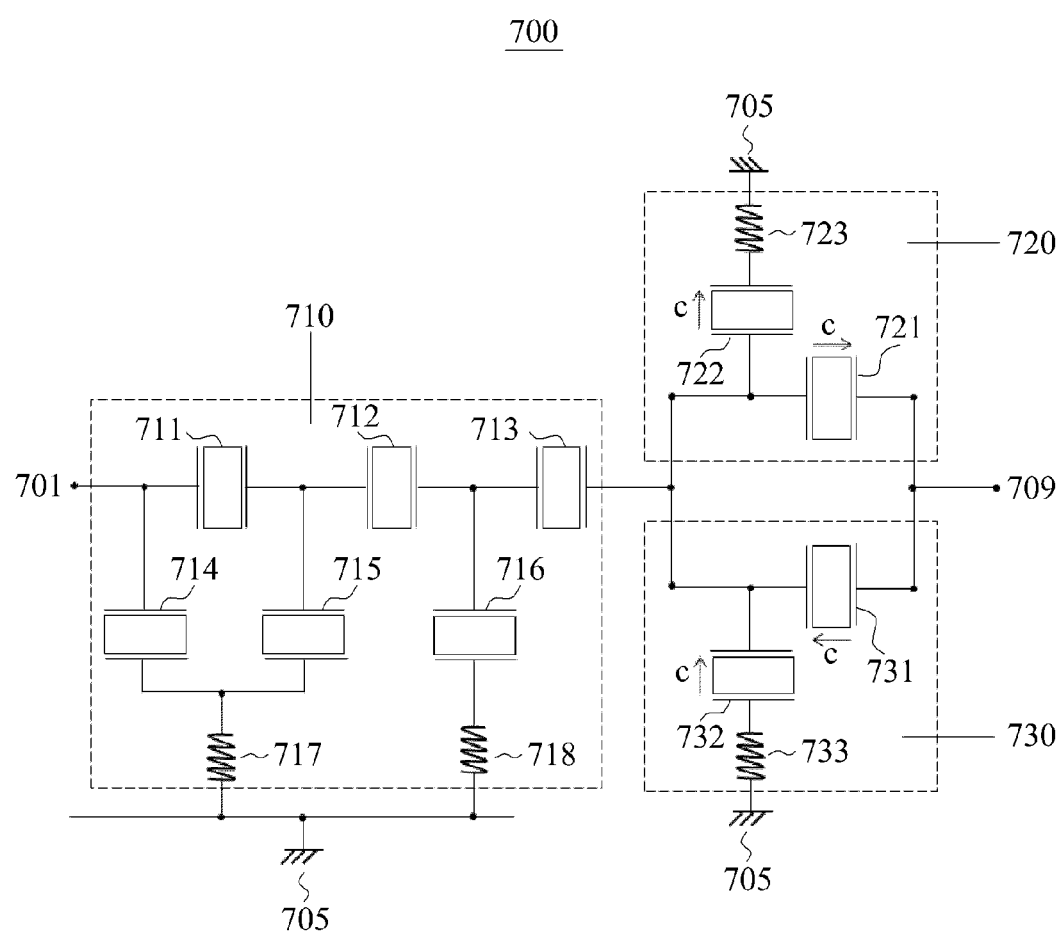
FIG. 7 illustrates an acoustic filter including a ladder-type filter circuit with inductors, in accordance with an embodiment.

FIG. 7 illustrates an acoustic filter 700 including a ladder-type filter circuit with inductors, in accordance with an embodiment.

The acoustic filter 700 of FIG. 7 includes a ladder-type filter circuit 710, a first branch ladder-type filter circuit 720, a second branch ladder-type filter circuit 730, a signal input port 701, a signal output port 709, and a ground 705. The signal input port 701 is connected to the ladder-type filter circuit 710. The ladder-type filter circuit 710 is connected in series to the first branch ladder-type filter circuit 720 and the second branch ladder-type filter circuit 730. The first branch ladder-type filter circuit 720 and the second branch ladder-type filter circuit 730 are connected in parallel to each other, and are connected to the signal output port 709.

As illustrated in FIG. 7, the ladder-type filter circuit 710 includes three serial resonators 711, 712 and 713, three shunt resonators 714, 715 and 716, and two inductors 717 and 718. The inductor 718 is connected in series between the shunt resonator 716 and the ground 705. The shunt resonators 714 and 715 are connected to the ground 705 through the same inductor, for example, the inductor 717. The first branch ladder-type filter circuit 720 includes a serial resonator 721, a shunt resonator 722, and an inductor 723. The inductor 723 is connected in series between the shunt resonator 722 and the ground 705. The second branch ladder-type filter circuit 730 includes a serial resonator 731, a shunt resonator 732, and an inductor 733. A circuit topology of the first branch ladder-type filter circuit 720 is identical to a circuit topology of the second branch ladder-type filter circuit 730.

C-axis directions of resonators in the first branch ladder-type filter circuit 720 are opposite to C-axis directions of corresponding resonators in the second branch ladder-type filter circuit 730. For example, a C-axis direction of the serial resonator 721 is opposite to a C-axis direction of the serial resonator 731, and a C-axis direction of the shunt resonator 722 is opposite to a C-axis direction of the shunt resonator 732. Consequently, nonlinear characteristics of the acoustic filter 700 are self-cancelled by the first branch ladder-type filter circuit 720 and the second branch ladder-type filter circuit 730.

Figure 8:
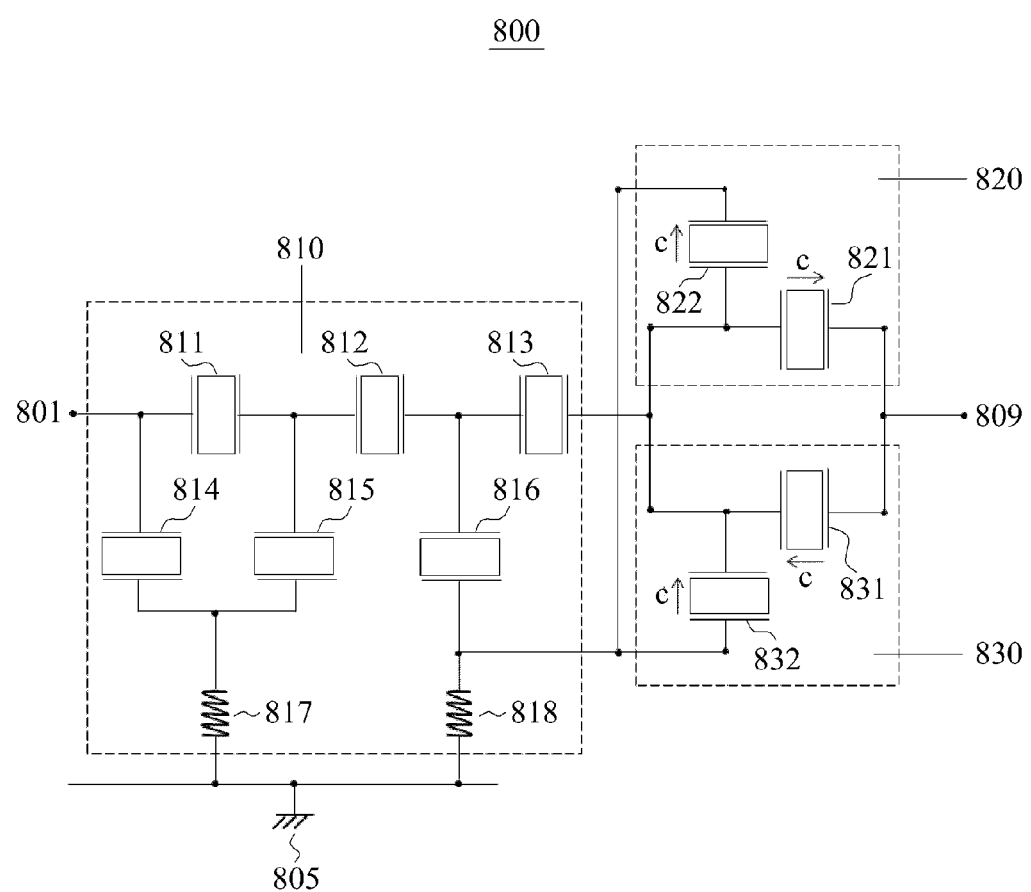
FIG. 8 illustrates an acoustic filter including a ladder-type filter circuit with inductors, in accordance with another embodiment.

FIG. 8 illustrates an acoustic filter 800 including a ladder-type filter circuit with inductors, in accordance with another embodiment.

The acoustic filter 800 of FIG. 8 includes a ladder-type filter circuit 810, a first branch ladder-type filter circuit 820, a second branch ladder-type filter circuit 830, a signal input port 801, a signal output port 809, and a ground 805. The signal input port 801 is connected to the ladder-type filter circuit 810. The ladder-type filter circuit 810 is connected in series to the first branch ladder-type filter circuit 820 and the second branch ladder-type filter circuit 830. The first branch ladder-type filter circuit 820 and the second branch ladder-type filter circuit 830 are connected in parallel to each other, and are connected to the signal output port 809.

As illustrated in FIG. 8, the ladder-type filter circuit 810 includes three serial resonators 811, 812 and 813, three shunt resonators 814, 815 and 816, and two inductors 817 and 818. The first branch ladder-type filter circuit 820 includes a serial resonator 821 and a shunt resonator 822. The second branch ladder-type filter circuit 830 includes a serial resonator 831 and a shunt resonator 832.

The shunt resonators 814 and 815 of the ladder-type filter circuit 810 are connected to the ground 805 through the same inductor, for example, the inductor 817. The shunt resonators 816, 822, and 832 are connected to the ground 805 through the same inductor, for example, the inductor 818. A circuit topology of the first branch ladder-type filter circuit 820 is identical to a circuit topology of the second branch ladder-type filter circuit 830.

C-axis directions of resonators in the first branch ladder-type filter circuit 820 are opposite to C-axis directions of corresponding resonators in the second branch ladder-type filter circuit 830. For example, a C-axis direction of the serial resonator 821 are opposite to a C-axis direction of the serial resonator 831, and a C-axis direction of the shunt resonator 822 is opposite to a C-axis direction of the shunt resonator 832. Consequently, nonlinear characteristics of the acoustic filter 800 are self-cancelled by the first branch ladder-type filter circuit 820 and the second branch ladder-type filter circuit 830.

Figure 9:
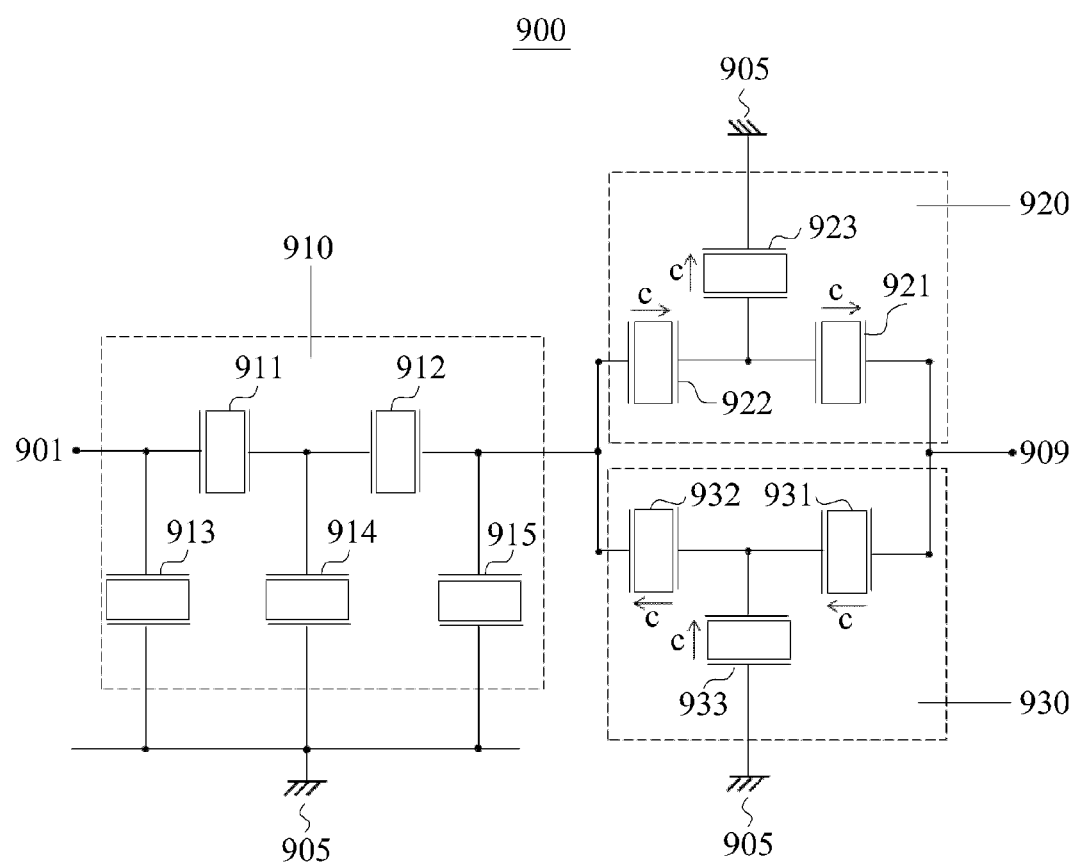
FIG. 9 illustrates an acoustic filter including a ladder-type filter circuit, a first branch ladder-type filter circuit and a second branch ladder-type filter circuit, in accordance with an embodiment.

FIG. 9 illustrates an acoustic filter 900 including a first branch ladder-type filter 920 circuit and a second branch ladder-type filter circuit 930, in accordance with an embodiment.

The acoustic filter 900 of FIG. 9 includes a ladder-type filter circuit 910, a first branch ladder-type filter circuit 920, a second branch ladder-type filter circuit 930, a signal input port 901, a signal output port 909, and a ground 905. The signal input port 901 is connected to the ladder-type filter circuit 910. The ladder-type filter circuit 910 is connected in series to the first branch ladder-type filter circuit 920 and the second branch ladder-type filter circuit 930. The first branch ladder-type filter circuit 920 and the second branch ladder-type filter circuit 930 are connected in parallel to each other, and are connected to the signal output port 909.

As illustrated in FIG. 9, the ladder-type filter circuit 910 includes two serial resonators 911 and 912, and three shunt resonators 913, 914, and 915. The first branch ladder-type filter circuit 920 includes two serial resonators 921 and 922, and a shunt resonator 923. A C-axis direction of the serial resonator 921 is identical to a C-axis direction of the serial resonator 922. The second branch ladder-type filter circuit 930 includes two serial resonators 931 and 932, and a shunt resonator 933. A C-axis direction of the serial resonator 931 is identical to a C-axis direction of the serial resonator 932. A circuit topology of the first branch ladder-type filter circuit 920 is identical to a circuit topology of the second branch ladder-type filter circuit 930.

C-axis directions of the serial and the shunt resonators 921, 922, and 923 in the first branch ladder-type filter circuit 920 are opposite to C-axis directions of corresponding serial and shunt resonators 931, 932, and 933 in the second branch ladder-type filter circuit 930. For example, the C-axis directions of the serial resonators 921 and 922 are respectively opposite to the C-axis directions of the serial resonators 931 and 932, and a C-axis direction of the shunt resonator 923 is opposite to a C-axis direction of the shunt resonator 933. Consequently, nonlinear characteristics of the acoustic filter 900 are self-cancelled by the first branch ladder-type filter circuit 920 and the second branch ladder-type filter circuit 930.

Figure 10:
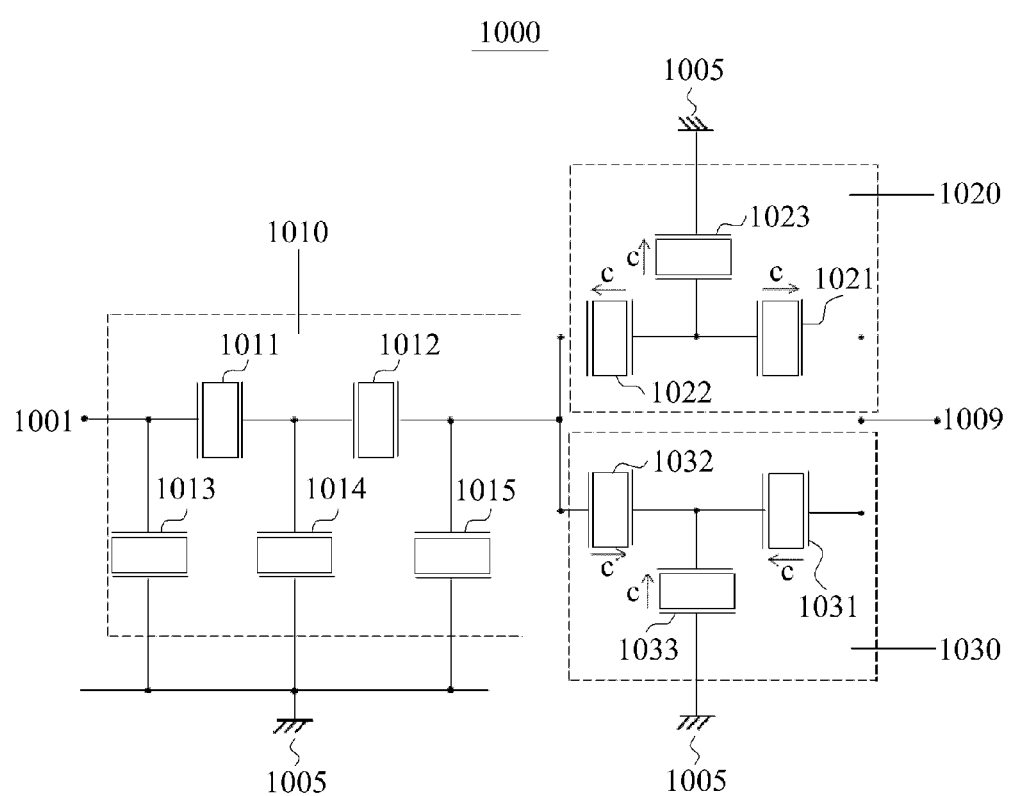
FIG. 10 illustrates an acoustic filter including a ladder-type filter circuit, a first branch ladder-type filter circuit and a second branch ladder-type filter circuit, in accordance with another embodiment.

FIG. 10 illustrates an acoustic filter 1000 including a ladder-type filter circuit 1010, a first branch ladder-type filter circuit 1020 and a second branch ladder-type filter circuit 1030, in accordance with another embodiment.

The acoustic filter 1000 of FIG. 10 includes a ladder-type filter circuit 1010, a first branch ladder-type filter circuit 1020, a second branch ladder-type filter circuit 1030, a signal input port 1001, a signal output port 1009, and a ground 1005. The signal input port 1001 is connected to the ladder-type filter circuit 1010. The ladder-type filter circuit 1010 is connected in series to the first branch ladder-type filter circuit 1020 and the second branch ladder-type filter circuit 1030. The first branch ladder-type filter circuit 1020 and the second branch ladder-type filter circuit 1030 are connected in parallel to each other, and are connected to the signal output port 1009.

As illustrated in FIG. 10, the ladder-type filter circuit 1010 includes two serial resonators 1011 and 1012, and three shunt resonators 1013, 1014 and 1015. The first branch ladder-type filter circuit 1020 includes two serial resonators 1021 and 1022, and a shunt resonator 1023. A C-axis direction of the serial resonator 1021 is opposite to a C-axis direction of the serial resonator 1022. The second branch ladder-type filter circuit 1030 includes two serial resonators 1031 and 1032, and a shunt resonator 1033. A C-axis direction of the serial resonator 1031 is opposite to a C-axis direction of the serial resonator 1032. A circuit topology of the first branch ladder-type filter circuit 1020 is identical to a circuit topology of the second branch ladder-type filter circuit 1030.

A C-axis direction of the serial resonator 1021 is opposite to a C-axis direction of the serial resonator 1022 in the first branch ladder-type filter circuit 1020. Also, a C-axis direction of the serial resonator 1031 is opposite to a C-axis direction of the serial resonator 1032 in the second branch ladder-type filter circuit 1030. Furthermore, C-axis directions of the serial resonators 1021 and 1022 in the first branch ladder-type filter circuit 1020 are opposite to C-axis directions of corresponding serial resonators 1031 and 1032, respectively, in the second branch ladder-type filter circuit 1030. For example, the C-axis directions of the serial resonators 1021 and 1022 are respectively opposite to the C-axis directions of the serial resonators 1031 and 1032. A C-axis direction of the shunt resonator 1023 is opposite to a C-axis direction of the shunt resonator 1033. Consequently, nonlinear characteristics of the acoustic filter 1000 are self-cancelled by the first branch ladder-type filter circuit 1020 and the second branch ladder-type filter circuit 1030.

Figure 11:
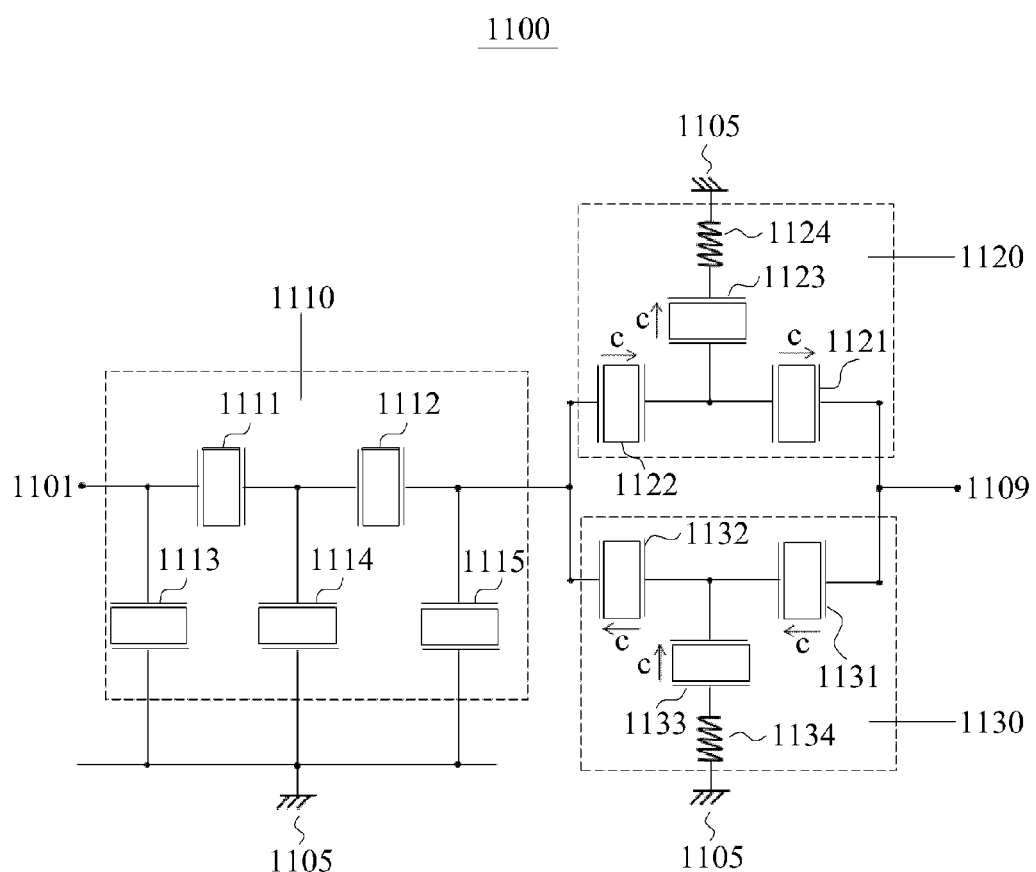
FIG. 11 illustrates an acoustic filter including a ladder-type filter circuit, a first branch ladder-type filter circuit with an inductor and a second branch ladder-type filter circuit with an inductor, in accordance with an embodiment.

FIG. 11 illustrates an acoustic filter 1100 including a ladder-type filter circuit 1110, a first branch ladder-type filter circuit 1120 with an inductor 1124, and a second branch ladder-type filter circuit 1130 with an inductor 1134, in accordance with an embodiment.

The acoustic filter 1100 of FIG. 11 includes a ladder-type filter circuit 1110, a first branch ladder-type filter circuit 1120, a second branch ladder-type filter circuit 1130, a signal input port 1101, a signal output port 1109, and a ground 1105. The signal input port 1101 is connected to the ladder-type filter circuit 1110. The ladder-type filter circuit 1110 is connected in series to the first branch ladder-type filter circuit 1120 and the second branch ladder-type filter circuit 1130. The first branch ladder-type filter circuit 1120 and the second branch ladder-type filter circuit 1130 are connected in parallel to each other, and are connected to the signal output port 1109.

As illustrated in FIG. 11, the ladder-type filter circuit 1110 includes two serial resonators 1111 and 1112, and three shunt resonators 1113, 1114, and 1115. The first branch ladder-type filter circuit 1120 includes two serial resonators 1121 and 1122, a shunt resonator 1123, and an inductor 1124. The inductor 1124 is connected in series between the shunt resonator 1123 and the ground 1105. The second branch ladder-type filter circuit 1130 includes two serial resonators 1131 and 1132, a shunt resonator 1133, and an inductor 1134. The inductor 1134 is connected in series between the shunt resonator 1133 and the ground 1105. A circuit topology of the first branch ladder-type filter circuit 1120 is identical to a circuit topology of the second branch ladder-type filter circuit 1130.

C-axis directions of the series and the shunt resonators 1121, 1122, and 1123 in the first branch ladder-type filter circuit 1120 are opposite to C-axis directions of corresponding resonators 1131, 1132, and 1133 in the second branch ladder-type filter circuit 1130. For example, C-axis directions of the serial resonators 1121 and 1122 are respectively opposite to C-axis directions of the serial resonators 1131 and 1132, and a C-axis direction of the shunt resonator 1123 are opposite to a C-axis direction of the shunt resonator 1133. Consequently, nonlinear characteristics of the acoustic filter 1100 are self-cancelled by the first branch ladder-type filter circuit 1120 and the second branch ladder-type filter circuit 1130.

Figure 12:
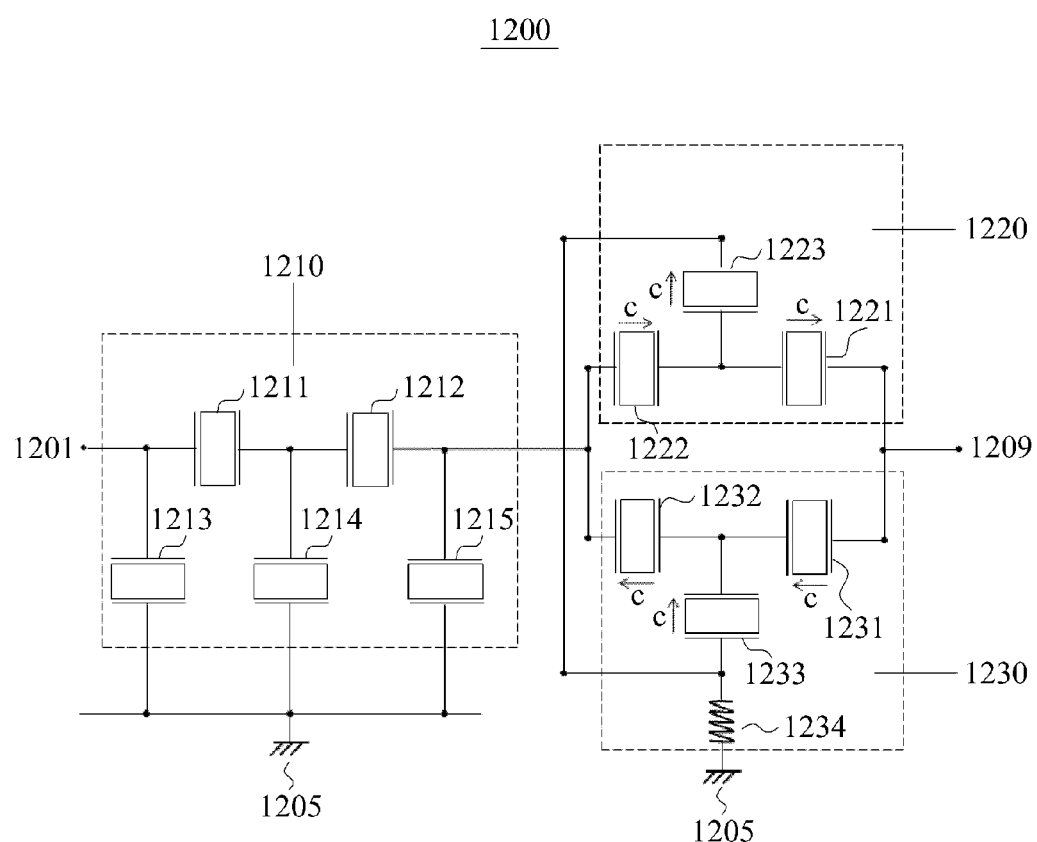
FIG. 12 illustrates an acoustic filter including a ladder-type filter circuit, a first branch ladder-type filter circuit and a second branch ladder-type filter circuit with an inductor, in accordance with an embodiment.

FIG. 12 illustrates an acoustic filter 1200 including a ladder-type filter circuit 1210, a first branch ladder-type filter circuit 1220, and a second branch ladder-type filter circuit 1230 with an inductor 1234, in accordance with an embodiment.

The acoustic filter 1200 of FIG. 12 includes a ladder-type filter circuit 1210, a first branch ladder-type filter circuit 1220, a second branch ladder-type filter circuit 1230, a signal input port 1201, a signal output port 1209, and a ground 1205. The signal input port 1201 is connected to the ladder-type filter circuit 1210. The ladder-type filter circuit 1210 is connected in series to the first branch ladder-type filter circuit 1220 and the second branch ladder-type filter circuit 1230. The first branch ladder-type filter circuit 1220 and the second branch ladder-type filter circuit 1230 are connected in parallel to each other, and are connected to the signal output port 1209.

As illustrated in FIG. 12, the ladder-type filter circuit 1210 includes two serial resonators 1211 and 1212, and three shunt resonators 1213, 1214 and 1215. The first branch ladder-type filter circuit 1220 includes two serial resonators 1221 and 1222, and a shunt resonator 1223. The second branch ladder-type filter circuit 1230 includes two serial resonators 1231 and 1232, a shunt resonator 1233, and an inductor 1234. The shunt resonators 1223 and 1233 are connected to the ground 1205 through the same inductor, for example, the inductor 1234.

C-axis directions of the serial and the shunt resonators 1221, 1222, and 1223 in the first branch ladder-type filter circuit 1220 are opposite to C-axis directions of corresponding serial and shunt resonators 1231, 1232, and 1233 in the second branch ladder-type filter circuit 1230. For example, C-axis directions of the serial resonators 1221 and 1222 are respectively opposite to C-axis directions of the serial resonators 1231 and 1232, and a C-axis direction of the shunt resonator 1223 are opposite to a C-axis direction of the shunt resonator 1233. Consequently, nonlinear characteristics of the acoustic filter 1200 are self-cancelled by the first branch ladder-type filter circuit 1220 and the second branch ladder-type filter circuit 1230.

Figure 13:
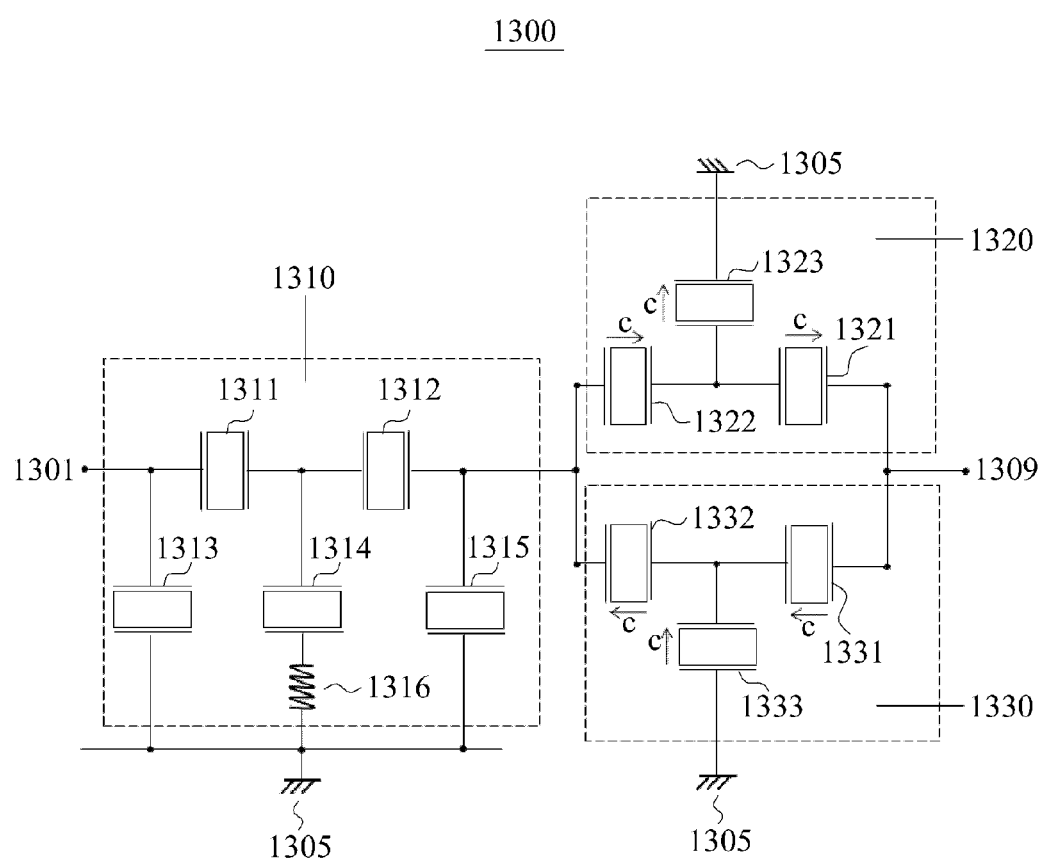
FIG. 13 illustrates an acoustic filter including a ladder-type filter circuit including an inductor, a first branch ladder-type filter circuit, and a second branch ladder-type filter circuit, in accordance with an embodiment.

FIG. 13 illustrates an acoustic filter 1300 including a ladder-type filter circuit 1310 including an inductor 1316, a first branch ladder-type filter circuit 1320, and a second branch ladder-type filter circuit 1330, in accordance with an embodiment.

The acoustic filter 1300 of FIG. 13 includes a ladder-type filter circuit 1310, a first branch ladder-type filter circuit 1320, a second branch ladder-type filter circuit 1330, a signal input port 1301, a signal output port 1309, and a ground 1305. The signal input port 1301 is connected to the ladder-type filter circuit 1310. The ladder-type filter circuit 1310 is connected in series to the first branch ladder-type filter circuit 1320 and the second branch ladder-type filter circuit 1330. The first branch ladder-type filter circuit 1320 and the second branch ladder-type filter circuit 1330 are connected in parallel to each other, and are connected to the signal output port 1309.

As illustrated in FIG. 13, the ladder-type filter circuit 1310 includes two serial resonators 1311 and 1312, three shunt resonators 1313, 1314, and 1315, and an inductor 1316. The inductor 1316 is connected in series between the shunt resonator 1314 and the ground 1305. The first branch ladder-type filter circuit 1320 includes two serial resonators 1321 and 1322, and a shunt resonator 1323. The second branch ladder-type filter circuit 1330 includes two serial resonators 1331 and 1332, and a shunt resonator 1333. A circuit topology of the first branch ladder-type filter circuit 1320 is identical to a circuit topology of the second branch ladder-type filter circuit 1330. Although the inductor 1316 is connected to the shunt resonator 1314, a person of ordinary skill in the relevant art will appreciate that the inductor 1316 may be connected in series with another of the shunt resonators of the ladder-type filter circuit 1310. C-axis directions of resonators in the first branch ladder-type filter circuit 1320 are opposite to C-axis directions of corresponding resonators in the second branch ladder-type filter circuit 1330. For example, C-axis directions of the serial resonators 1321 and 1322 are respectively opposite to C-axis directions of the serial resonators 1331 and 1332, and a C-axis direction of the shunt resonator 1323 is opposite to a C-axis direction of the shunt resonator 1333. Consequently, nonlinear characteristics of the acoustic filter 1300 are self-cancelled by the first branch ladder-type filter circuit 1320 and the second branch ladder-type filter circuit 1330.

Figure 14:
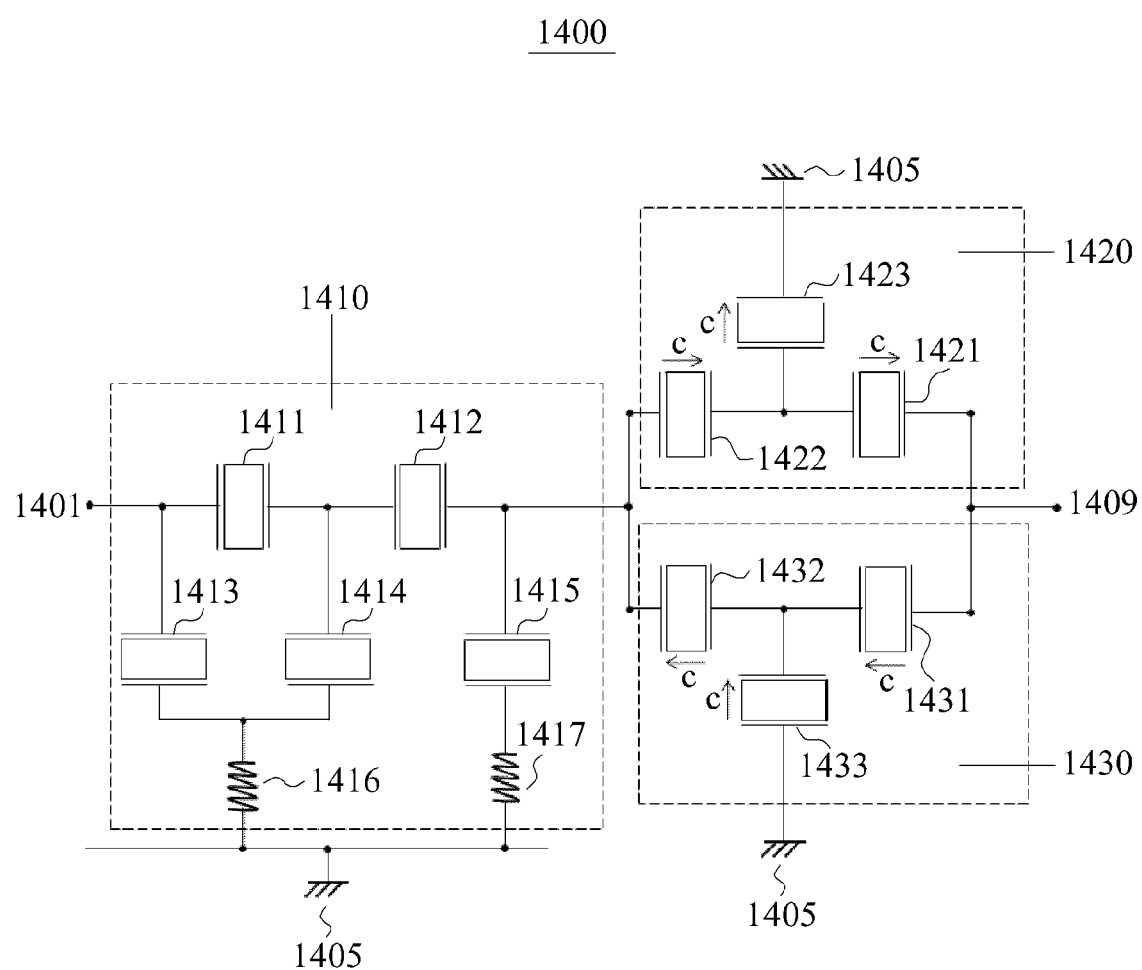
FIG. 14 illustrates an acoustic filter including a ladder-type filter circuit with inductors, a first branch ladder-type filter circuit, and a second branch ladder-type filter circuit, in accordance with an embodiment.

FIG. 14 illustrates an acoustic filter 1400 including a ladder-type filter circuit with inductors, a first branch ladder-type filter circuit 1420, and a second branch ladder-type filter circuit 1430, in accordance with an embodiment.

The acoustic filter 1400 of FIG. 14 includes a ladder-type filter circuit 1410, a first branch ladder-type filter circuit 1420, a second branch ladder-type filter circuit 1430, a signal input port 1401, a signal output port 1409, and a ground 1405. The signal input port 1401 is connected to the ladder-type filter circuit 1410. The ladder-type filter circuit 1410 is connected in series to the first branch ladder-type filter circuit 1420 and the second branch ladder-type filter circuit 1430. The first branch ladder-type filter circuit 1420 and the second branch ladder-type filter circuit 1430 are connected in parallel to each other, and are connected to the signal output port 1409.

As illustrated in FIG. 14, the ladder-type filter circuit 1410 includes two serial resonators 1411 and 1412, three shunt resonators 1413, 1414 and 1415, and two inductors 1416 and 1417. The shunt resonators 1413 and 1414 are connected to the ground 1405 through the same inductor, for example, the inductor 1416. The inductor 1417 is connected in series between the shunt resonator 1415 and the ground 1405. The first branch ladder-type filter circuit 1420 includes two serial resonators 1421 and 1422, and a shunt resonator 1423. The second branch ladder-type filter circuit 1430 includes two serial resonators 1431 and 1432, and a shunt resonator 1433. A circuit topology of the first branch ladder-type filter circuit 1420 is identical to a circuit topology of the second branch ladder-type filter circuit 1430.

C-axis directions of resonators in the first branch ladder-type filter circuit 1420 are opposite to C-axis directions of corresponding resonators in the second branch ladder-type filter circuit 1430. For example, C-axis directions of the serial resonators 1421 and 1422 are respectively opposite to C-axis directions of the serial resonators 1431 and 1432, and a C-axis direction of the shunt resonator 1423 is opposite to a C-axis direction of the shunt resonator 1433. Consequently, nonlinear characteristics of the acoustic filter 1400 are self-cancelled by the first branch ladder-type filter circuit 1420 and the second branch ladder-type filter circuit 1430.

Figure 15:
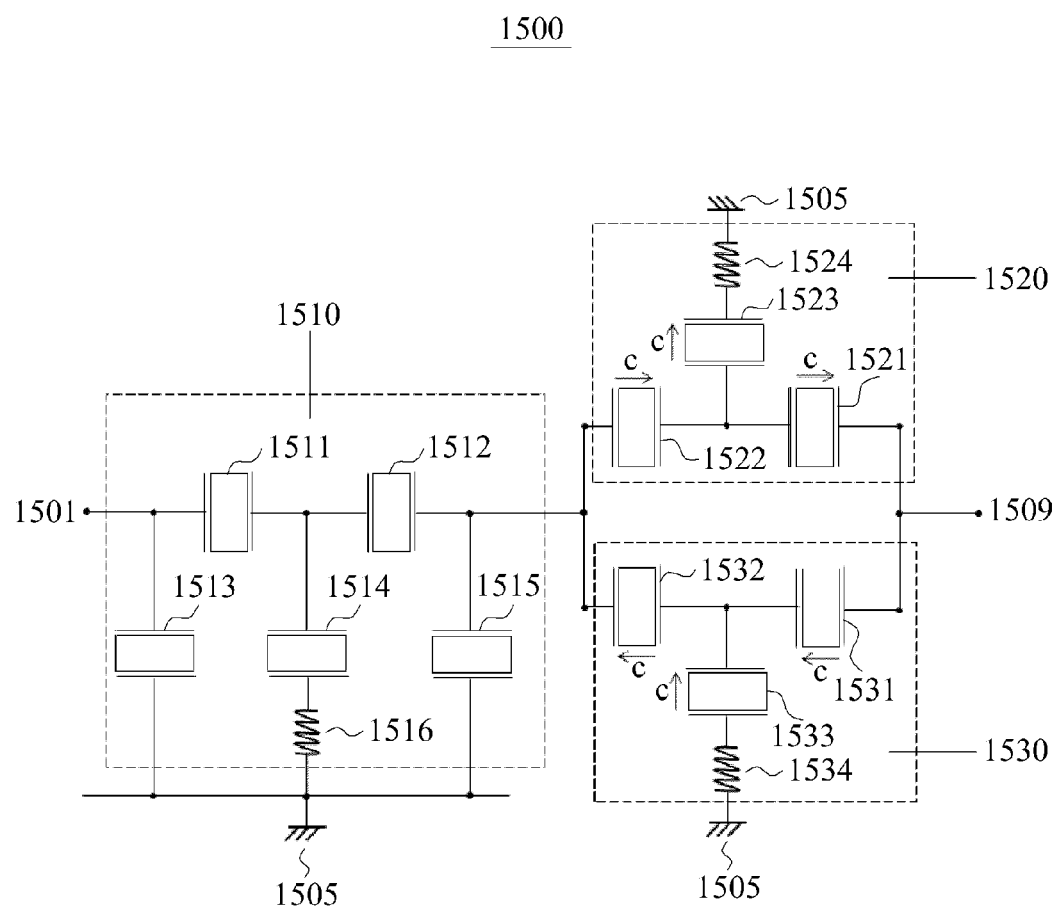
FIG. 15 illustrates an acoustic filter including a ladder-type filter circuit with an inductor, a first branch ladder-type filter circuit with an inductor, and a second branch ladder-type filter circuit with an inductor, in accordance with an embodiment.

FIG. 15 illustrates an acoustic filter 1500 including a ladder-type filter circuit 1510 with an inductor 1516, a first branch ladder-type filter circuit 1520 with an inductor 1524, and a second branch ladder-type filter circuit 1530 with an inductor 1534, in accordance with an embodiment.

The acoustic filter 1500 of FIG. 15 includes a ladder-type filter circuit 1510, a first branch ladder-type filter circuit 1520, a second branch ladder-type filter circuit 1530, a signal input port 1501, a signal output port 1509, and a ground 1505. The signal input port 1501 is connected to the ladder-type filter circuit 1510. The ladder-type filter circuit 1510 is connected in series to the first branch ladder-type filter circuit 1520 and the second branch ladder-type filter circuit 1530. The first branch ladder-type filter circuit 1520 and the second branch ladder-type filter circuit 1530 are connected in parallel to each other, and are connected to the signal output port 1509.

As illustrated in FIG. 15, the ladder-type filter circuit 1510 includes two serial resonators 1511 and 1512, three shunt resonators 1513, 1514 and 1515, and an inductor 1516. The inductor 1516 is connected in series between the shunt resonator 1514 and the ground 1505. The first branch ladder-type filter circuit 1520 includes two serial resonators 1521 and 1522, a shunt resonator 1523, and an inductor 1524. The inductor 1524 is connected in series between the shunt resonator 1523 and the ground 1505. The second branch ladder-type filter circuit 1530 includes two serial resonators 1531 and 1532, a shunt resonator 1533, and an inductor 1534. The inductor 1534 is connected in series between the shunt resonator 1533 and the ground 1505. A circuit topology of the first branch ladder-type filter circuit 1520 is identical to a circuit topology of the second branch ladder-type filter circuit 1530. Although the inductor 1516 is connected to the shunt resonator 1514, a person of ordinary skill in the relevant art will appreciate that the inductor 1516 may be connected in series with another of the shunt resonators of the ladder-type filter circuit 1510.

C-axis directions of the serial and the shunt resonators 1521, 1522, and 1523 in the first branch ladder-type filter circuit 1520 are opposite to C-axis directions of corresponding serial and shunt resonators 1531, 1532, and 1533 in the second branch ladder-type filter circuit 1530. For example, C-axis directions of the serial resonators 1521 and 1522 are respectively opposite to C-axis directions of the serial resonators 1531 and 1532, and a C-axis direction of the shunt resonator 1523 is opposite to a C-axis direction of the shunt resonator 1533. Consequently, nonlinear characteristics of the acoustic filter 1500 are self-cancelled by the first branch ladder-type filter circuit 1520 and the second branch ladder-type filter circuit 1530.

Figure 16:
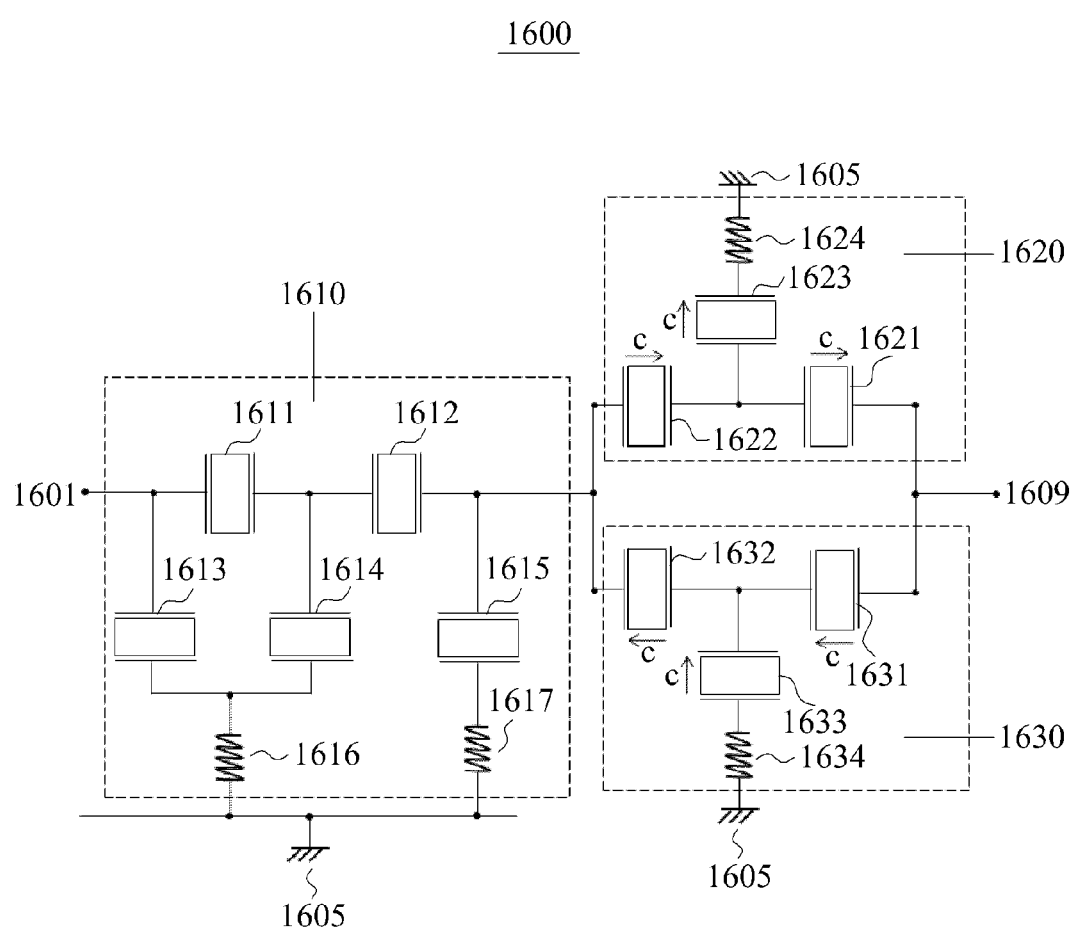
FIG. 16 illustrates an acoustic filter including a ladder-type filter circuit with inductors, a first branch ladder-type filter circuit with an inductor, and a second branch ladder-type filter circuit with an inductor, in accordance with an embodiment.

FIG. 16 illustrates an acoustic filter 1600 including a ladder-type filter circuit with inductors, a first branch ladder-type filter circuit 1620 with an inductor 1624, and a second branch ladder-type filter circuit 1630 with an inductor 1634, in accordance with an embodiment.

The acoustic filter 1600 of FIG. 16 includes a ladder-type filter circuit 1610, a first branch ladder-type filter circuit 1620, a second branch ladder-type filter circuit 1630, a signal input port 1601, a signal output port 1609, and a ground 1605. The signal input port 1601 is connected to the ladder-type filter circuit 1610. The ladder-type filter circuit 1610 is connected in series to the first branch ladder-type filter circuit 1620 and the second branch ladder-type filter circuit 1630. The first branch ladder-type filter circuit 1620 and the second branch ladder-type filter circuit 1630 are connected in parallel to each other, and are connected to the signal output port 1609.

As illustrated in FIG. 16, the ladder-type filter circuit 1610 includes two serial resonators 1611 and 1612, three shunt resonators 1613, 1614 and 1615, and two inductors 1616 and 1617. The shunt resonators 1613 and 1614 are connected to the ground 1605 through the same inductor, for example, the inductor 1616. The inductor 1617 is connected in series between the shunt resonator 1615 and the ground 1605. The first branch ladder-type filter circuit 1620 includes two serial resonators 1621 and 1622, a shunt resonator 1623, and an inductor 1624. The inductor 1624 is connected in series between the shunt resonator 1623 and the ground 1605. The second branch ladder-type filter circuit 1630 includes two serial resonators 1631 and 1632, a shunt resonator 1633, and an inductor 1634. The inductor 1634 is connected in series between the shunt resonator 1633 and the ground 1605. A circuit topology of the first branch ladder-type filter circuit 1620 is identical to a circuit topology of the second branch ladder-type filter circuit 1630.

C-axis directions of the series and the shunt resonators 1621, 1622, and 1623 in the first branch ladder-type filter circuit 1620 are opposite to C-axis directions of corresponding series and shunt resonators 1631, 1632, and 1633 in the second branch ladder-type filter circuit 1630. For example, C-axis directions of the serial resonators 1621 and 1622 are respectively opposite to C-axis directions of the serial resonators 1631 and 1632, and a C-axis direction of the shunt resonator 1623 are opposite to a C-axis direction of the shunt resonator 1633. Consequently, nonlinear characteristics of the acoustic filter 1600 are self-cancelled by the first branch ladder-type filter circuit 1620 and the second branch ladder-type filter circuit 1630.

Figure 17:
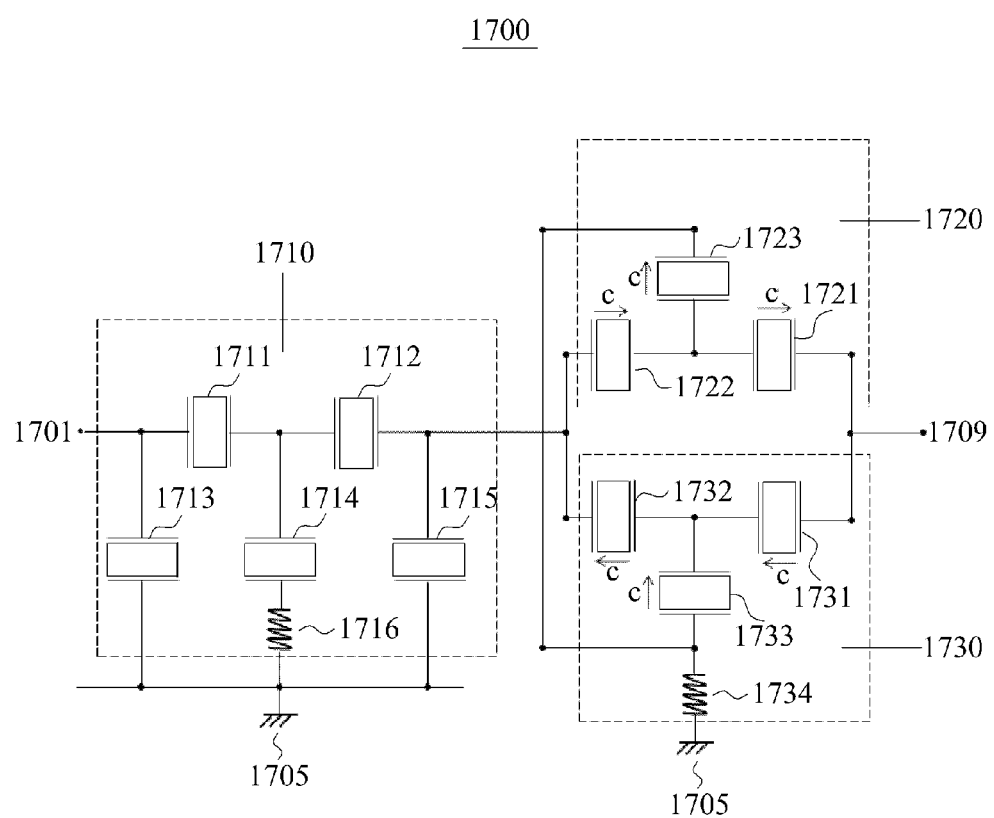
FIG. 17 illustrates an acoustic filter including a ladder-type filter circuit, a first branch ladder-type filter circuit, and a second branch ladder-type filter circuit with an inductor, in accordance with an embodiment.

FIG. 17 illustrates an acoustic filter 1700 including a ladder-type filter circuit, a first branch ladder-type filter circuit 1720, and a second branch ladder-type filter circuit 1730 with an inductor 1734, in accordance with an embodiment.

The acoustic filter 1700 of FIG. 17 includes a ladder-type filter circuit 1710, a first branch ladder-type filter circuit 1720, a second branch ladder-type filter circuit 1730, a signal input port 1701, a signal output port 1709, and a ground 1705. The signal input port 1701 is connected to the ladder-type filter circuit 1710. The ladder-type filter circuit 1710 is connected in series to the first branch ladder-type filter circuit 1720 and the second branch ladder-type filter circuit 1730. The first branch ladder-type filter circuit 1720 and the second branch ladder-type filter circuit 1730 are connected in parallel to each other, and are connected to the signal output port 1709.

As illustrated in FIG. 17, the ladder-type filter circuit 1710 includes two serial resonators 1711 and 1712, three shunt resonators 1713, 1714 and 1715, and an inductor 1716. The inductor 1716 is connected in series between the shunt resonator 1714 and the ground 1705. The first branch ladder-type filter circuit 1720 includes two serial resonators 1721 and 1722, and a shunt resonator 1723. The second branch ladder-type filter circuit 1730 includes two serial resonators 1731 and 1732, a shunt resonator 1733, and an inductor 1734. The shunt resonators 1723 and 1733 may be connected to the ground 1705 through the same inductor, for example, the inductor 1734. Although the inductor 1716 is connected to the shunt resonator 1714, a person of ordinary skill in the relevant art will appreciate that the inductor 1716 may be connected in series with another of the shunt resonators of the ladder-type filter circuit 1710.

C-axis directions of the serial and the shunt resonators 1721, 1722, and 1723 in the first branch ladder-type filter circuit 1720 are opposite to C-axis directions of corresponding resonators 1731, 1732, and 1733 in the second branch ladder-type filter circuit 1730. For example, C-axis directions of the serial resonators 1721 and 1722 are respectively opposite to C-axis directions of the serial resonators 1731 and 1732, and a C-axis direction of the shunt resonator 1723 are opposite to a C-axis direction of the shunt resonator 1733. Consequently, nonlinear characteristics of the acoustic filter 1700 are self-cancelled by the first branch ladder-type filter circuit 1720 and the second branch ladder-type filter circuit 1730.

Figure 18:
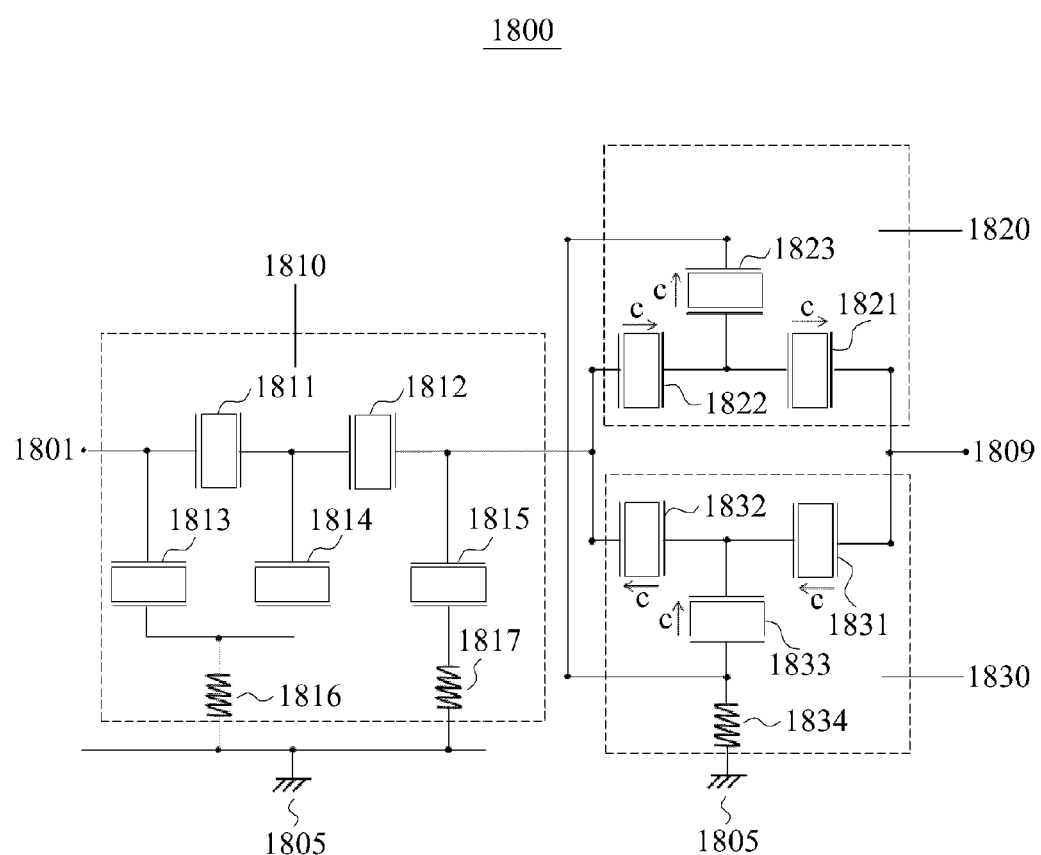
FIG. 18 illustrates an acoustic filter including a ladder-type filter circuit with inductors, a first branch ladder-type filter circuit, and a second branch ladder-type filter circuit with an inductor, in accordance with an embodiment.

FIG. 18 illustrates an acoustic filter 1800 including a ladder-type filter circuit with inductors, a first branch ladder-type filter circuit 1820, and a second branch ladder-type filter circuit 1830 with an inductor 1834, in accordance with an embodiment.

The acoustic filter 1800 of FIG. 18 includes a ladder-type filter circuit 1810, a first branch ladder-type filter circuit 1820, a second branch ladder-type filter circuit 1830, a signal input port 1801, a signal output port 1809, and a ground 1805. The signal input port 1801 is connected to the ladder-type filter circuit 1810. The ladder-type filter circuit 1810 is connected in series to the first branch ladder-type filter circuit 1820 and the second branch ladder-type filter circuit 1830. The first branch ladder-type filter circuit 1820 and the second branch ladder-type filter circuit 1830 are connected in parallel to each other, and are connected to the signal output port 1809.

As illustrated in FIG. 18, the ladder-type filter circuit 1810 includes two serial resonators 1811 and 1812, three shunt resonators 1813, 1814 and 1815, and two inductors 1816 and 1817. The shunt resonators 1813 and 1814 are connected to the ground 1805 through the same inductor, for example, the inductor 1816. The inductor 1817 is connected in series between the shunt resonator 1815 and the ground 1805. The first branch ladder-type filter circuit 1820 includes two serial resonators 1821 and 1822, and a shunt resonator 1823. The second branch ladder-type filter circuit 1830 includes two serial resonators 1831 and 1832, a shunt resonator 1833, and an inductor 1834. The shunt resonators 1813 and 1814 are connected to the ground 1805 through the same inductor, for example, the inductor 1834.

C-axis directions of the series and the shunt resonators 1821, 1822, and 1823 in the first branch ladder-type filter circuit 1820 are opposite to C-axis directions of corresponding resonators 1831, 1832, and 1833 in the second branch ladder-type filter circuit 1830. For example, C-axis directions of the serial resonators 1821 and 1822 are respectively opposite to C-axis directions of the serial resonators 1831 and 1832, and a C-axis direction of the shunt resonator 1823 is opposite to a C-axis direction of the shunt resonator 1833. Consequently, nonlinear characteristics of the acoustic filter 1800 are self-cancelled by the first branch ladder-type filter circuit 1820 and the second branch ladder-type filter circuit 1830.

Figure 19:
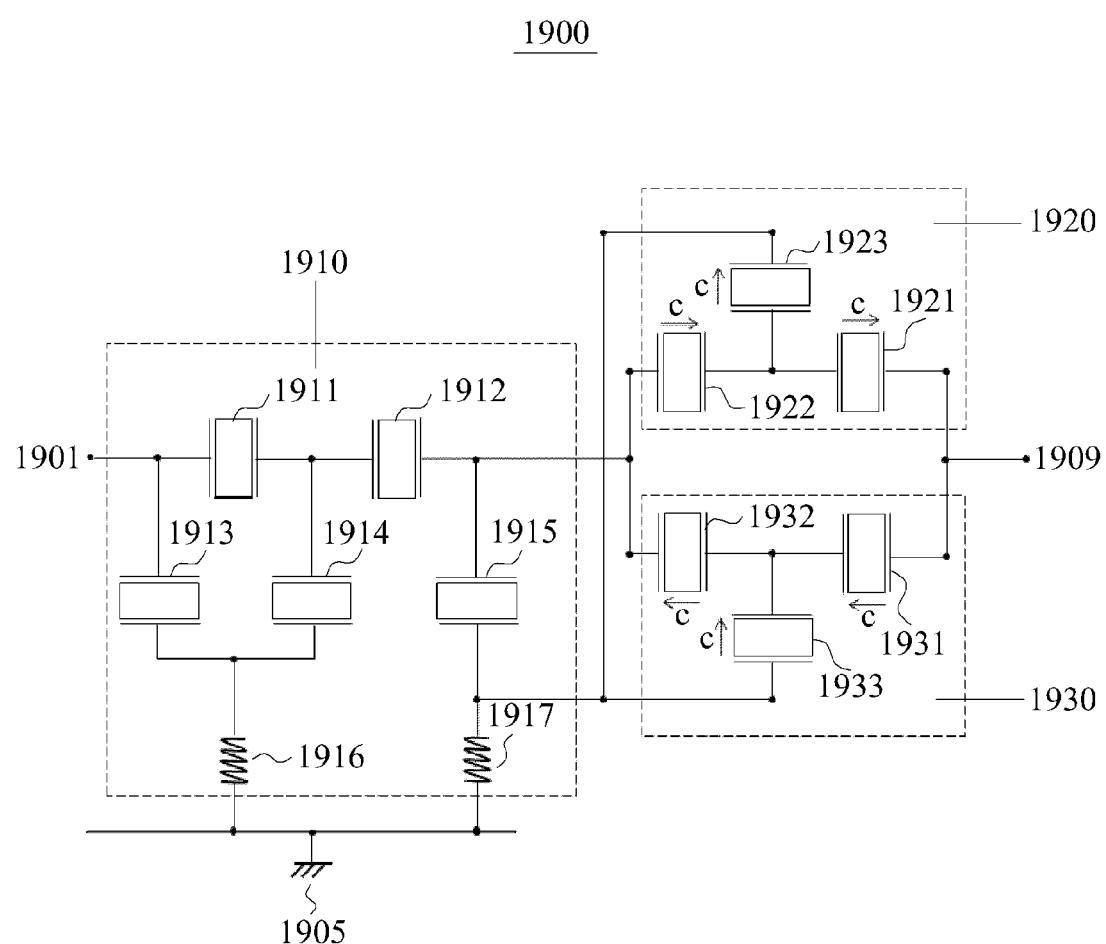
FIG. 19 illustrates an acoustic filter including a ladder-type filter circuit with inductors, a first branch ladder-type filter circuit, and a second branch ladder-type filter circuit, in accordance with another embodiment.

FIG. 19 illustrates an acoustic filter 1900 including a ladder-type filter circuit with inductors, a first branch ladder-type filter circuit 1920, and a second branch ladder-type filter circuit 1930, in accordance with another embodiment.

The acoustic filter 1900 of FIG. 19 includes a ladder-type filter circuit 1910, a first branch ladder-type filter circuit 1920, a second branch ladder-type filter circuit 1930, a signal input port 1901, a signal output port 1909, and a ground 1905. The signal input port 1901 is connected to the ladder-type filter circuit 1910. The ladder-type filter circuit 1910 is connected in series to the first branch ladder-type filter circuit 1920 and the second branch ladder-type filter circuit 1930. The first branch ladder-type filter circuit 1920 and the second branch ladder-type filter circuit 1930 are connected in parallel to each other, and are connected to the signal output port 1909.

As illustrated in FIG. 19, the ladder-type filter circuit 1910 includes two serial resonators 1911 and 1912, three shunt resonators 1913, 1914 and 1915, and two inductors 1916 and 1917. The shunt resonators 1913 and 1914 are connected to the ground 1905 through the same inductor 1916. The first branch ladder-type filter circuit 1920 includes two serial resonators 1921 and 1922, and a shunt resonator 1923. The second branch ladder-type filter circuit 1930 includes two serial resonators 1931 and 1932, and a shunt resonator 1933. The shunt resonators 1923, 1933, and 1915 are connected to the ground 1905 through the same inductor, for example, the inductor 1917. A circuit topology of the first branch ladder-type filter circuit 1920 is identical to a circuit topology of the second branch ladder-type filter circuit 1930.

C-axis directions of the serial and the shunt resonators 1921, 1922, and 1923 in the first branch ladder-type filter circuit 1920 are opposite to C-axis directions of corresponding resonators 1931, 1932, and 1933 in the second branch ladder-type filter circuit 1930. For example, C-axis directions of the serial resonators 1921 and 1922 are respectively opposite to C-axis directions of the serial resonators 1931 and 1932, and a C-axis direction of the shunt resonator 1923 is opposite to a C-axis direction of the shunt resonator 1933. Consequently, nonlinear characteristics of the acoustic filter 1900 are self-cancelled by the first branch ladder-type filter circuit 1920 and the second branch ladder-type filter circuit 1930.

Figure 20:
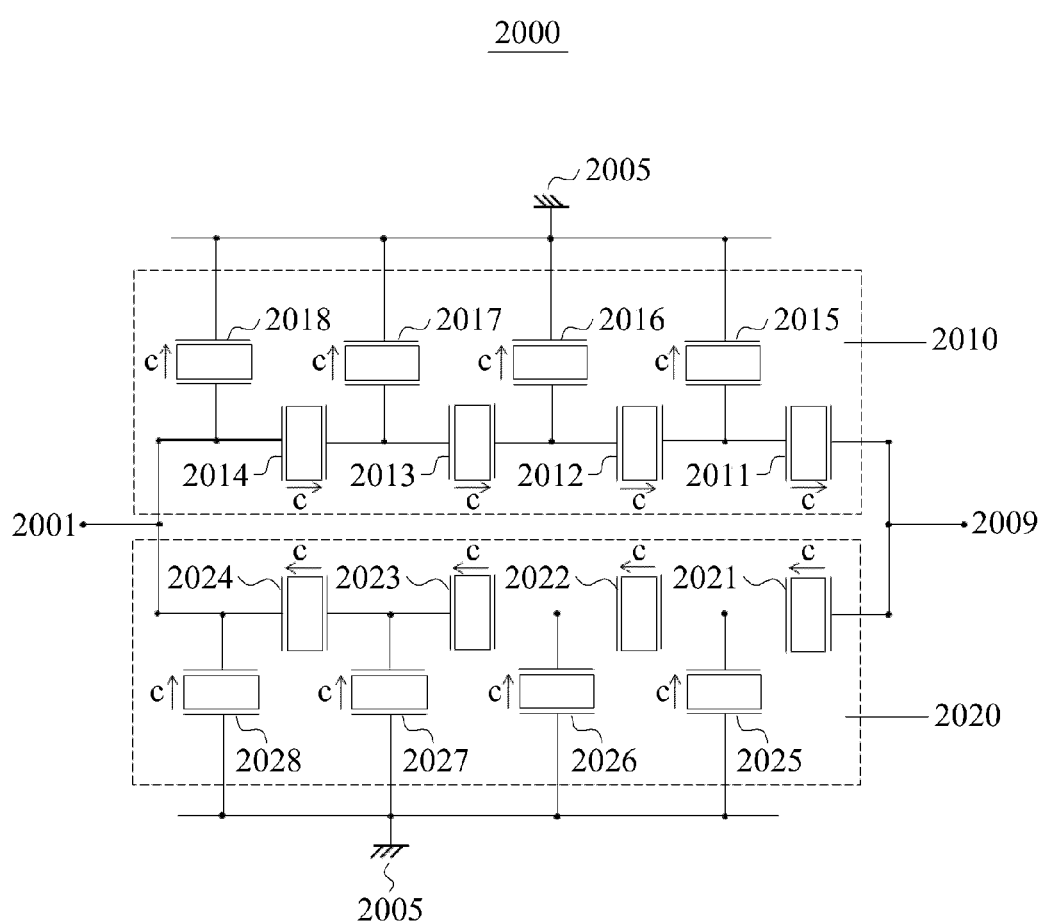
FIG. 20 illustrates an acoustic filter, in accordance with a further alternative embodiment.

FIG. 20 illustrates an acoustic filter 2000, in accordance with a further alternative embodiment.

The acoustic filter 2000 of FIG. 20 includes a first branch ladder-type filter circuit 2010, a second branch ladder-type filter circuit 2020, a signal input port 2001, a signal output port 2009, and a ground 2005. The signal input port 2001 is connected to the first branch ladder-type filter circuit 2010 and the second branch ladder-type filter circuit 2020. The first branch ladder-type filter circuit 2010 and the second branch ladder-type filter circuit 2020 are connected in parallel to each other, and are connected to the signal output port 2009.

As illustrated in FIG. 20, the first branch ladder-type filter circuit 2010 includes four serial resonators 2011, 2012, 2013 and 2014, and four shunt resonators 2015, 2016, 2017 and 2018. The second branch ladder-type filter circuit 2020 includes four serial resonators 2021, 2022, 2023 and 2024, and four shunt resonators 2025, 2026, 2027 and 2028. A circuit topology of the first branch ladder-type filter circuit 2010 is identical to a circuit topology of the second branch ladder-type filter circuit 2020. For example, the serial resonators 2011, 2012, 2013 and 2014, and the shunt resonators 2015, 2016, 2017 and 2018 in the first branch ladder-type filter circuit 2010, and the serial resonators 2021, 2022, 2023 and 2024, and the shunt resonators 2025, 2026, 2027 and 2028 in the second branch ladder-type filter circuit 2020 are connected in a ladder configuration.

C-axis directions of the serial resonators 2011, 2012, 2013, and 2014 in the first branch ladder-type filter circuit 2010 are opposite to C-axis directions of corresponding serial resonators 2021, 2022, 2023, and 2024 in the second branch ladder-type filter circuit 2020. For example, a C-axis direction of the serial resonator 2011 is opposite to a C-axis direction of the serial resonator 2021. C-axis directions of the shunt resonators 2015, 2016, 2017, and 2018 in the first branch ladder-type filter circuit 2010 are opposite to C-axis directions of corresponding shunt resonators 2025, 2026, 2027, and 2028 in the second branch ladder-type filter circuit 2020. For example, a C-axis direction of the shunt resonator 2015 is opposite to a C-axis direction of the shunt resonator 2025. Consequently, nonlinear characteristics of the acoustic filter 2000 are self-cancelled by the first branch ladder-type filter circuit 2010 and the second branch ladder-type filter circuit 2020.

Figure 21:
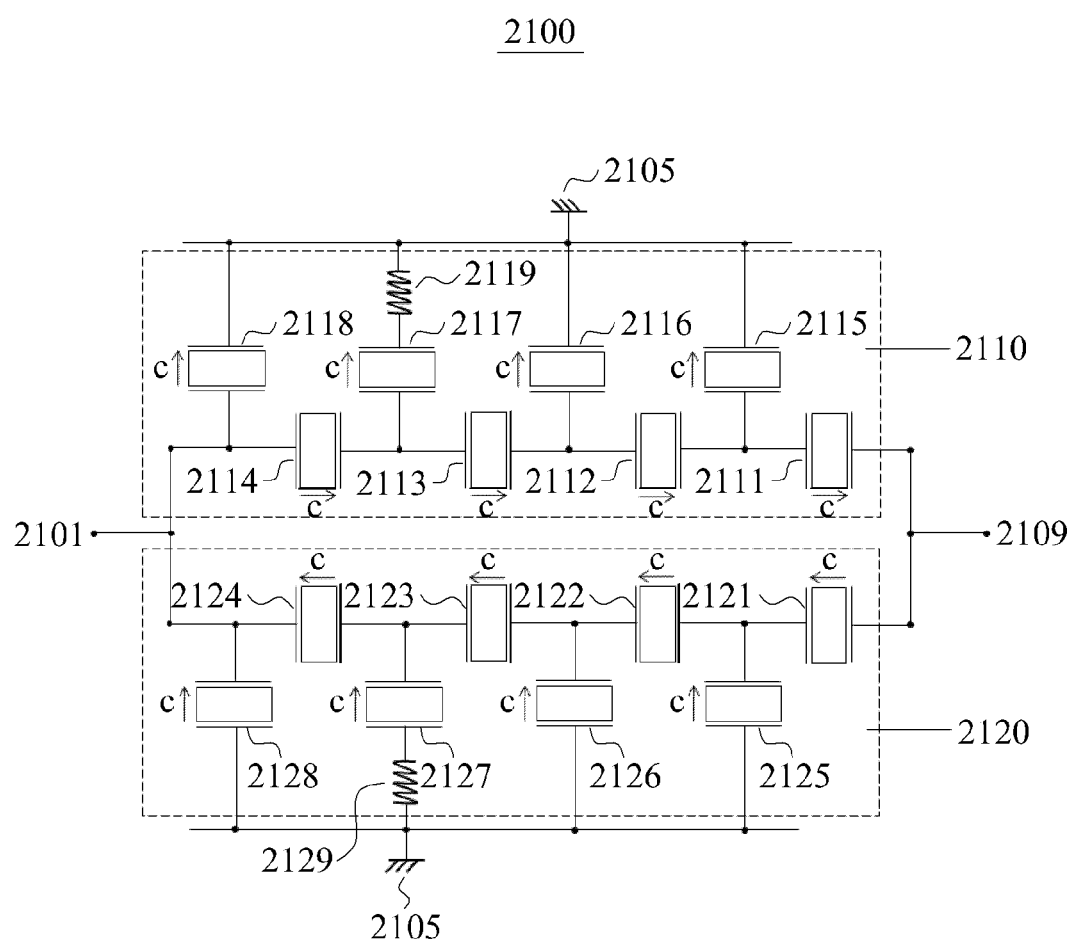
FIG. 21 illustrates an acoustic filter including a first branch ladder-type filter circuit with an inductor, and a second branch ladder-type filter circuit with an inductor, in accordance with a further alternative embodiment.

FIG. 21 illustrates an acoustic filter 2100 including a first branch ladder-type filter circuit 2110 with an inductor 2119, and a second branch ladder-type filter circuit 2120 with an inductor 2129, in accordance with a further alternative embodiment.

The acoustic filter 2100 of FIG. 21 includes a first branch ladder-type filter circuit 2110, a second branch ladder-type filter circuit 2120, a signal input port 2101, a signal output port 2109, and a ground 2105. The signal input port 2101 is connected to the first branch ladder-type filter circuit 2110 and the second branch ladder-type filter circuit 2120. The first branch ladder-type filter circuit 2110 and the second branch ladder-type filter circuit 2120 are connected in parallel to each other, and are connected to the signal output port 2109.

As illustrated in FIG. 21, the first branch ladder-type filter circuit 2110 includes four serial resonators 2111, 2112, 2113 and 2114, four shunt resonators 2115, 2116, 2117 and 2118, and an inductor 2119. The inductor 2119 is connected in series between the shunt resonator 2117 and the ground 2105. The second branch ladder-type filter circuit 2120 includes four serial resonators 2121, 2122, 2123 and 2124, four shunt resonators 2125, 2126, 2127 and 2128, and an inductor 2129. The inductor 2129 is connected in series between the shunt resonator 2127 and the ground 2105. A circuit topology of the first branch ladder-type filter circuit 2110 is identical to a circuit topology of the second branch ladder-type filter circuit 2120. Although the inductors 2119 and 2129 are connected in series with the shunt resonators 2117 and 2127, respectively, a person of ordinary skill in the relevant art will appreciate that the inductors 2119 and 2129 may be connected in series with another of the shunt resonators of the first branch ladder-type filter circuit 2110 and the second branch ladder-type filter circuit 2120.

C-axis directions of the serial resonators 2111, 2112, 2113, and 2114 in the first branch ladder-type filter circuit 2110 are opposite to C-axis directions of corresponding resonators 2021, 2022, 2023, and 2024 in the second branch ladder-type filter circuit 2120. For example, a C-axis direction of the serial resonator 2111 is opposite to a C-axis direction of the serial resonator 2121. Also, C-axis directions of the shunt resonators 2115, 2116, 2117, and 2118 in the first branch ladder-type filter circuit 2110 are opposite to C-axis directions of corresponding shunt resonators 2125, 2126, 2127, and 2128 in the second branch ladder-type filter circuit 2120. For example, a C-axis direction of the shunt resonator 2115 is opposite to a C-axis direction of the shunt resonator 2125. Consequently, nonlinear characteristics of the acoustic filter 2100 are self-cancelled by the first branch ladder-type filter circuit 2110 and the second branch ladder-type filter circuit 2120.

Figure 22:
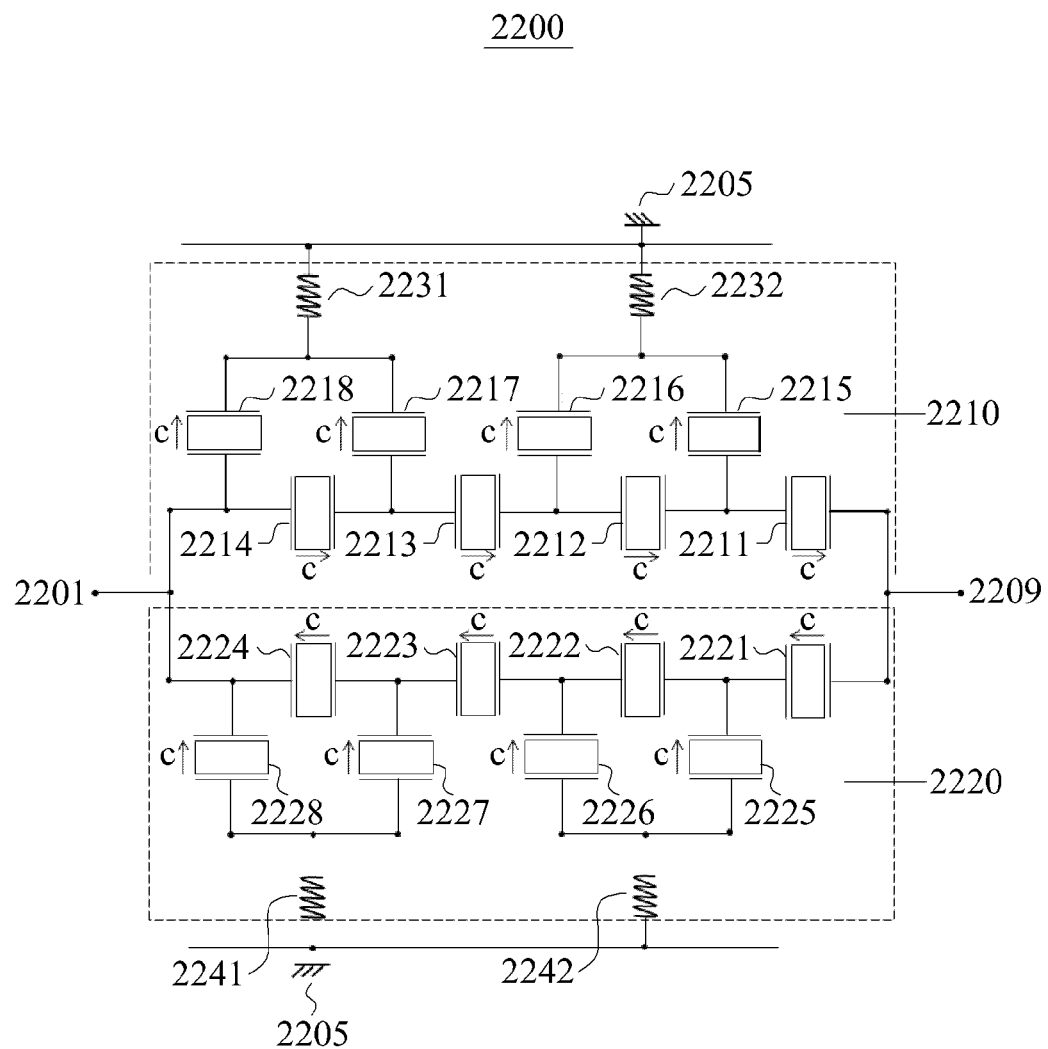
FIG. 22 illustrates an acoustic filter including a first branch ladder-type filter circuit with inductors, and a second branch ladder-type filter circuit with inductors, in accordance with a further alternative embodiment.

FIG. 22 illustrates an acoustic filter 2200 including a first branch ladder-type filter circuit 2210 with inductors 2231 and 2232, and a second branch ladder-type filter circuit 2220 with inductors 2241 and 2242, in accordance with a further alternative embodiment.

The acoustic filter 2200 of FIG. 22 includes a first branch ladder-type filter circuit 2210, a second branch ladder-type filter circuit 2220, a signal input port 2201, a signal output port 2209, and a ground 2205. The signal input port 2201 is connected to the first branch ladder-type filter circuit 2210 and the second branch ladder-type filter circuit 2220. The first branch ladder-type filter circuit 2210 and the second branch ladder-type filter circuit 2220 are connected in parallel to each other, and are connected to the signal output port 2209.

As illustrated in FIG. 22, the first branch ladder-type filter circuit 2210 includes four serial resonators 2211, 2212, 2213 and 2214, four shunt resonators 2215, 2216, 2217 and 2218, and two inductors 2231 and 2232. The shunt resonators 2215 and 2216 are connected to the ground 2205 through the inductor 2232, and the shunt resonators 2217 and 2218 are connected to the ground 2205 through the inductor 2231. The second branch ladder-type filter circuit 2220 includes four serial resonators 2221, 2222, 2223 and 2224, four shunt resonators 2225, 2226, 2227 and 2228, and two inductors 2241 and 2242. The shunt resonators 2225 and 2226 are connected to the ground 2205 through the inductor 2242, and the shunt resonators 2227 and 2228 are connected to the ground 2205 through the inductor 2241. A circuit topology of the first branch ladder-type filter circuit 2210 is identical to a circuit topology of the second branch ladder-type filter circuit 2220.

C-axis directions of the serial resonators 2211, 2212, 2213, and 2214 in the first branch ladder-type filter circuit 2210 are opposite to C-axis directions of corresponding resonators 2221, 2222, 2223, and 2224 in the second branch ladder-type filter circuit 2220. For example, a C-axis direction of the serial resonator 2211 is opposite to a C-axis direction of the serial resonator 2221. Also, C-axis directions of the shunt resonators 2215, 2216, 2217, and 2218 in the first branch ladder-type filter circuit 2210 are opposite to C-axis directions of corresponding shunt resonators 2225, 2226, 2227, and 2228 in the second branch ladder-type filter circuit 2220. For example, a C-axis direction of the shunt resonator 2215 may be opposite to a C-axis direction of the shunt resonator 2225. Consequently, nonlinear characteristics of the acoustic filter 2200 are self-cancelled by the first branch ladder-type filter circuit 2210 and the second branch ladder-type filter circuit 2220.

Figure 23:
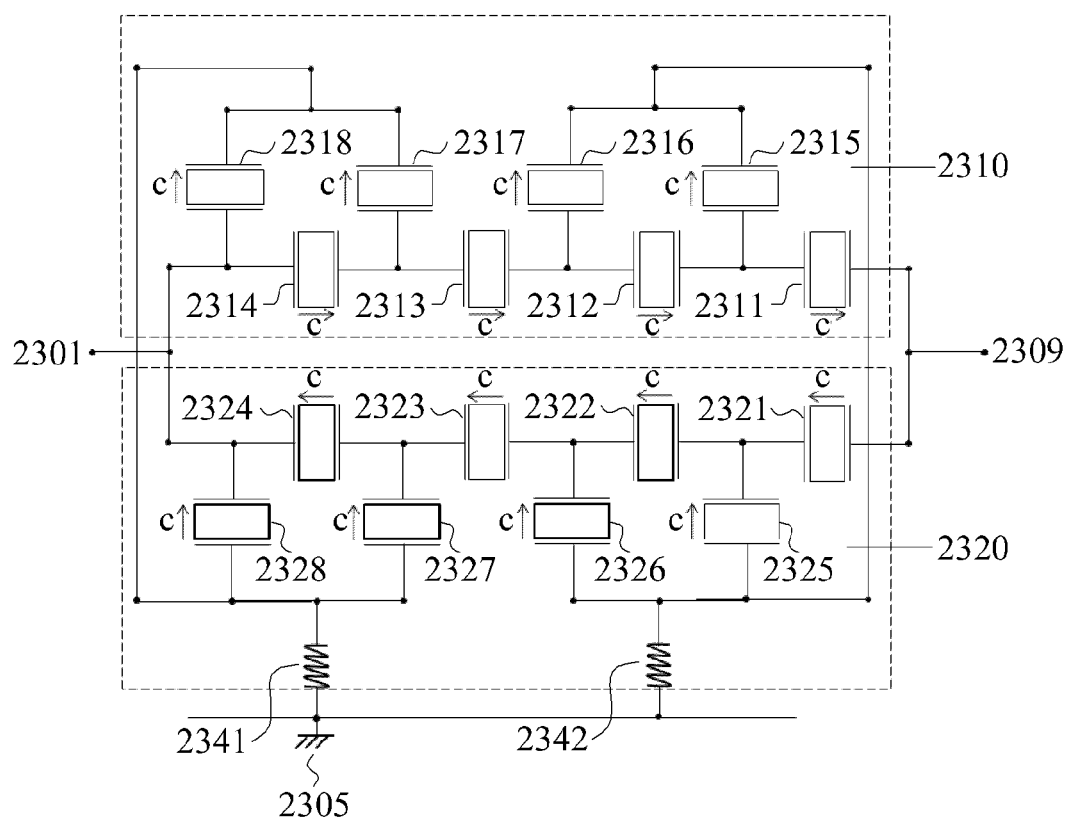
FIG. 23 illustrates an acoustic filter including a first branch ladder-type filter circuit, and a second branch ladder-type filter circuit with inductors, in accordance with a further alternative embodiment.

FIG. 23 illustrates an acoustic filter 2300 including a first branch ladder-type filter circuit 2310, and a second branch ladder-type filter circuit 2320 with inductors 2341 and 2342, in accordance with a further alternative embodiment.

The acoustic filter 2300 of FIG. 23 includes a first branch ladder-type filter circuit 2310, a second branch ladder-type filter circuit 2320, a signal input port 2301, a signal output port 2309, and a ground 2305. The signal input port 2301 is connected to the first branch ladder-type filter circuit 2310 and the second branch ladder-type filter circuit 2320. The first branch ladder-type filter circuit 2310 and the second branch ladder-type filter circuit 2320 are connected in parallel to each other, and are connected to the signal output port 2309.

As illustrated in FIG. 23, the first branch ladder-type filter circuit 2310 includes four serial resonators 2311, 2312, 2313 and 2314, and four shunt resonators 2315, 2316, 2317 and 2318. The second branch ladder-type filter circuit 2320 includes four serial resonators 2321, 2322, 2323 and 2324, four shunt resonators 2325, 2326, 2327 and 2328, and two inductors 2341 and 2342. The shunt resonators 2315, 2316, 2325 and 2326 are connected to the ground 2305 through the inductor 2342, and the shunt resonators 2317, 2318, 2327 and 2328 are connected to the ground 2305 through the inductor 2341.

C-axis directions of the serial resonators 2311, 2312, 2313, and 2314 in the first branch ladder-type filter circuit 2310 are opposite to C-axis directions of corresponding resonators 2311, 2312, 2313, and 2314 in the second branch ladder-type filter circuit 2320. For example, a C-axis direction of the serial resonator 2311 is opposite to a C-axis direction of the serial resonator 2321. Also, C-axis directions of the shunt resonators 2315, 2316, 2317, and 2318 in the first branch ladder-type filter circuit 2310 are opposite to C-axis directions of corresponding shunt resonators 2325, 2326, 2327, and 2328 in the second branch ladder-type filter circuit 2320. For example, a C-axis direction of the shunt resonator 2315 is opposite to a C-axis direction of the shunt resonator 2325. Consequently, nonlinear characteristics of the acoustic filter 2300 are self-cancelled by the first branch ladder-type filter circuit 2310 and the second branch ladder-type filter circuit 2320.

Figure 24:
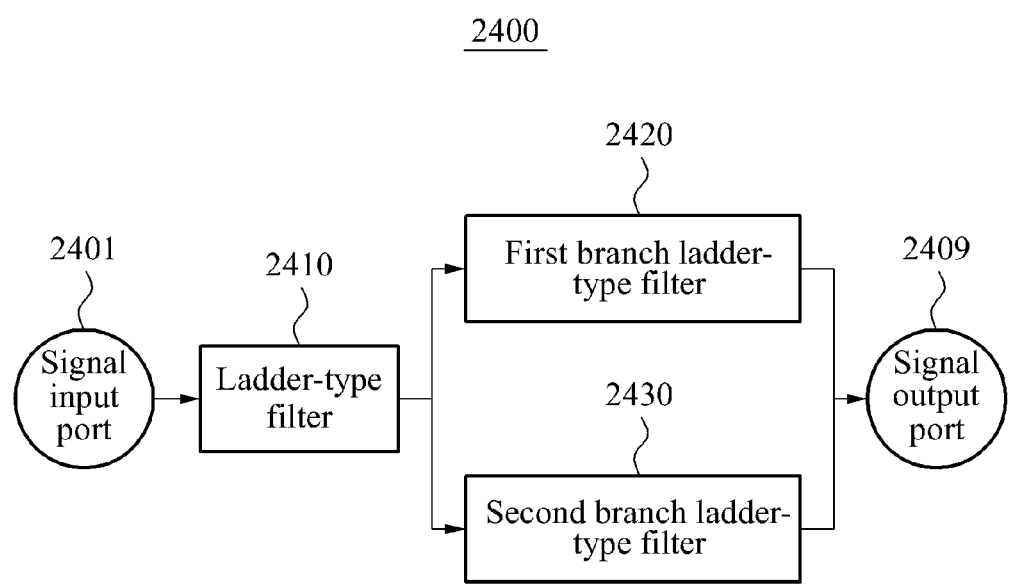
FIG. 24 illustrates an acoustic filter, in accord with an embodiment.

FIG. 24 illustrates an acoustic filter 2400, in accord with an embodiment.

In an example, the acoustic filter 2400 includes a signal input port 2401, a ladder-type filter 2410, a first branch ladder-type filter 2420, a second branch ladder-type filter 2430, and a signal output port 2409, as illustrated in FIG. 24. The first branch ladder-type filter 2420 and the second branch ladder-type filter 2430 are connected in parallel to each other. The signal input port 2401 is connected to the ladder-type filter 2410.

In this example, the ladder-type filter 2410 is connected in series to the first branch ladder-type filter 2420 and the second branch ladder-type filter 2430. The first branch ladder-type filter 2420 and the second branch ladder-type filter 2430 are connected to the signal output port 2409.

In one illustrative configuration, the ladder-type filter 2410 includes at least one serial resonator and at least one shunt resonator. In another configuration, the ladder-type filter 2410 includes at least one serial resonator and an inductor. In another example, the ladder-type filter 2410 includes at least one shunt resonator and an inductor.

In one example, the first branch ladder-type filter 2420 includes a serial resonator and a shunt resonator, and the second branch ladder-type filter 2430 includes a serial resonator and a shunt resonator. In another example, one of the first branch ladder-type filter 2420 and the second branch ladder-type filter 2430 includes at least two serial resonators, a single shunt resonator, and an inductor. One of the first branch ladder-type filter 2420 and the second branch ladder-type filter 2430 includes at least two shunt resonators, a single serial resonator, and an inductor.

Additionally, a topology of the first branch ladder-type filter 2420 may be identical to a topology of the second branch ladder-type filter 2430. Furthermore, C-axis directions of resonators in the first branch ladder-type filter 2420 may be opposite to C-axis directions of corresponding resonators in the second branch ladder-type filter 2430.

In another example, the acoustic filter 2400 may include a signal input port 2401, a ladder-type filter 2410, a first branch ladder-type filter 2420, a second branch ladder-type filter 2430, and a signal output port 2409. The first branch ladder-type filter 2420 and the second branch ladder-type filter 2430 are connected in parallel to each other. The signal input port 2401 may be connected to the first branch ladder-type filter 2420 and the second branch ladder-type filter 2430. The first branch ladder-type filter 2420 and the second branch ladder-type filter 2430 may be connected to the signal output port 2409.

In this example, one of the first branch ladder-type filter 2420 and the second branch ladder-type filter 2430 includes at least two serial resonators, a single shunt resonator, and an inductor. Additionally, the acoustic filter 2400 may include at least two shunt resonators, a single serial resonator, and an inductor. A topology of the first branch ladder-type filter 2420 may be identical to a topology of the second branch ladder-type filter 2430. Furthermore, C-axis directions of resonators in the first branch ladder-type filter 2420 may be opposite to C-axis directions of corresponding resonators in the second branch ladder-type filter 2430.

In still another example, the acoustic filter 2400 may include a signal input port 2401, a ladder-type filter 2410, a first branch ladder-type filter 2420, a second branch ladder-type filter 2430, and a signal output port 2409. The first branch ladder-type filter 2420 and the second branch ladder-type filter 2430 may be connected in parallel to each other. The signal input port 2401 may be connected to the ladder-type filter 2410.

In this example, the ladder-type filter 2410 may be connected in series to the first branch ladder-type filter 2420 and the second branch ladder-type filter 2430. The first branch ladder-type filter 2420 and the second branch ladder-type filter 2430 may be connected to the signal output port 2409. Additionally, the ladder-type filter 2410 may include at least one serial resonator, or a single shunt resonator. One of the first branch ladder-type filter 2420 and the second branch ladder-type filter 2430 may include a single serial resonator, and a single shunt resonator. A shunt resonator in the first branch ladder-type filter 2420 and a shunt resonator in the second branch ladder-type filter 2430 may be connected to a ground through different inductors or the same inductor.

In addition, a topology of the first branch ladder-type filter 2420 may be identical to a topology of the second branch ladder-type filter 2430. Furthermore, C-axis directions of resonators in the first branch ladder-type filter 2420 may be opposite to C-axis directions of corresponding resonators in the second branch ladder-type filter 2430.

In the above-described examples, serial resonators and shunt resonators may be BAW resonators.

Additionally, sizes of serial resonators in the first branch ladder-type filter 2420 may be identical to or different from sizes of serial resonators in the second branch ladder-type filter 2430.

Furthermore, sizes of shunt resonators in the first branch ladder-type filter 2420 may be identical to or different from sizes of shunt resonators in the second branch ladder-type filter 2430.

The circuits described herein may be implemented using a single hardware component, such as a resonator, or multiple hardware components. For example, the hardware components may include resonators, inductors, filters, convertors, and processing devices. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

As a non-exhaustive illustration only, a terminal or device described herein may refer to mobile devices such as a cellular phone, a personal digital assistant (PDA), a digital camera, a portable game console, and an MP3 player, a portable/personal multimedia player (PMP), a handheld e-book, a portable laptop PC, a global positioning system (GPS) navigation, a tablet, a sensor, and devices such as a desktop PC, a high definition television (HDTV), an optical disc player, a setup box, a home appliance, and the like that are capable of wireless communication or network communication consistent with that which is disclosed herein.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An acoustic filter, comprising:
    a ladder-type filter connected to a signal input port; and
    a first branch ladder-type filter and a second branch ladder-type filter connected in parallel to each other and connected in series between the ladder-type filter and the signal output port.
2. The acoustic filter of claim 1,
    wherein the ladder-type filter comprises serial resonators, and shunt resonators, and
    wherein the serial resonators and the shunt resonators are connected in a ladder configuration.
3. The acoustic filter of claim 1,
    wherein the ladder-type filter comprises serial resonators, shunt resonators, and an inductor, and
    wherein the inductor is connected in series between a ground and one of the shunt resonators.

4. The acoustic filter of claim 1, wherein each of the ladder-type filter, the first branch ladder-type filter, and the second branch ladder-type filter comprises a serial resonator and a shunt resonator.

5. The acoustic filter of claim 1,
wherein each of the first branch ladder-type filter and the second branch ladder-type filter comprises a serial resonator, a shunt resonator, and an inductor,
wherein the shunt resonator of the first branch ladder-type filter is connected to a ground through the inductor of the first branch ladder-type filter, and
wherein the shunt resonator of the second branch ladder-type filter is connected to the ground through the inductor of the second branch ladder-type filter.

6. The acoustic filter of claim 1,
wherein the ladder-type filter comprises an inductor,
wherein each of the first branch ladder-type filter and the second branch ladder-type filter comprises a shunt resonator and a serial resonator, and
wherein the shunt resonator is connected to a ground through the inductor.

7. The acoustic filter of claim 1,
wherein each of the first branch ladder-type filter and the second branch ladder-type filter comprises serial resonators and a shunt resonator, and
wherein C-axis directions of the serial resonators in the first branch ladder-type filter are identical to each other and C-axis directions of the serial resonators in the second branch ladder-type filter are identical to each other.

8. The acoustic filter of claim 1,
wherein each of the first branch ladder-type filter and the second branch ladder-type filter comprises serial resonators and a shunt resonator, and
wherein C-axis directions of the serial resonators in the first branch ladder-type filter are opposite to each other and C-axis directions of the serial resonators in the second branch ladder-type filter are opposite to each other.

9. The acoustic filter of claim 1,
wherein each of the first branch ladder-type filter and the second branch ladder-type filter comprises serial resonators, a shunt resonator, and an inductor,
wherein the inductor of the first branch ladder-type filter is connected in series between a ground and the shunt resonator of the first branch ladder-type filter, and
wherein the inductor of the second branch ladder-type filter is connected in series between the ground and the shunt resonator of the second branch ladder-type filter.

10. The acoustic filter of claim 1,
wherein the first branch ladder-type filter comprises serial resonators and a shunt resonator,
wherein the second branch ladder-type filter comprises serial resonators, a shunt resonator, and an inductor,
wherein the shunt resonators are connected to a ground through the inductor.

11. The acoustic filter of claim 1,
wherein each of the first branch ladder-type filter and the second branch ladder-type filter comprises a serial resonator and a shunt resonator,
wherein a C-axis direction of the serial resonator in the first branch ladder-type filter is opposite to a C-axis direction of the serial resonator in the second branch ladder-type filter, and wherein a C-axis direction of the shunt resonator in the first branch ladder-type filter is opposite to a C-axis direction of the shunt resonator in the second branch ladder-type filter.

12. The acoustic filter of claim 1,
wherein each of the ladder-type filter, the first branch ladder-type filter, and the second branch ladder-type filter comprises a serial resonator and a shunt resonator, and
wherein the serial resonator and the shunt resonator are bulk acoustic wave (BAW) resonators.

13. The acoustic filter of claim 1,
wherein the first branch ladder-type filter comprises a serial resonator,
wherein the second branch ladder-type filter comprises a serial resonator, and
wherein the serial resonator of the first branch ladder-type filter has the same size as the serial resonator of the second branch ladder-type filter.

14. The acoustic filter of claim 1,
wherein the first branch ladder-type filter comprises a shunt resonator,
wherein the second branch ladder-type filter comprises a shunt resonator, and
wherein the shunt resonator of the first branch ladder-type filter has the same size as the shunt resonator of the second branch ladder-type filter.

15. An acoustic filter, comprising:
a first branch ladder-type filter and a second branch ladder-type filter connected in parallel to each other, and connected in series between a signal input port and a signal output port;
wherein each of the first branch ladder-type filter and the second branch ladder-type filter comprise at least one serial resonator and at least one shunt resonator, and
wherein at least one of:
each respective C-axis direction of the at least one serial resonator in the first branch ladder-type filter is identical, or
each respective C-axis direction of the at least one shunt resonator in the first branch ladder-type filter is identical, or
each respective C-axis direction of the at least one serial resonator in the second branch ladder-type filter is identical, or
each respective C-axis direction of the at least one shunt resonator in the second branch ladder-type filter is identical; and
wherein each respective C-axis direction of the at least one shunt resonator in the first branch ladder-type filter is opposite to each respective C-axis direction of the at least one shunt resonator in the second branch ladder-type filter.

16. The acoustic filter of claim 15,
wherein the first branch ladder-type filter further comprises an inductor, and
wherein the inductor is connected in series between a ground and one of the at least one shunt resonator.

17. The acoustic filter of claim 15,
wherein the second branch ladder-type filter further comprises an inductor, and
wherein the inductor is connected in series between a ground and one of the at least one shunt resonator.

18. The acoustic filter of claim 15,
wherein the second branch ladder-type filter further comprises an inductor, and wherein the at least one shunt resonator in the first branch ladder-type filter and the at least one shunt resonator in the second branch ladder-type filter are connected to a ground through the inductor.

* * * * *